United States Patent
Sato et al.

(10) Patent No.: US 6,724,647 B1
(45) Date of Patent: Apr. 20, 2004

(54) VARIABLE LOGICAL CIRCUIT, SEMICONDUCTOR INTEGRATED CIRCUIT, AND METHOD FOR MANUFACTURING SEMICONDUCTOR INTEGRATED CIRCUIT

(75) Inventors: Masayuki Sato, Takasaki (JP); Isao Shimizu, Tamamura (JP); Hideaki Takahashi, Tokyo (JP); Yoshikazu Saitoh, Hamura (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/069,453

(22) PCT Filed: Jan. 28, 2000

(86) PCT No.: PCT/JP00/00431
§ 371 (c)(1), (2), (4) Date: Apr. 24, 2002

(87) PCT Pub. No.: WO01/56160
PCT Pub. Date: Aug. 2, 2001

(51) Int. Cl.$^7$ .............................................. G11C 11/00
(52) U.S. Cl. ................. 365/154; 365/156; 365/205; 365/207; 365/221; 365/220; 365/230.06
(58) Field of Search ................................ 365/154, 156, 365/205, 207, 230.06, 220, 221

(56) References Cited

U.S. PATENT DOCUMENTS

| | | | | |
|---|---|---|---|---|
| 4,870,302 A | | 9/1989 | Freeman | 326/41 |
| 4,888,737 A | * | 12/1989 | Sato | 365/203 |
| 4,893,278 A | * | 1/1990 | Ito | 365/203 |
| 6,205,086 B1 | * | 3/2001 | Hanzawa et al. | 365/233 |
| 2002/0041242 A1 | * | 4/2002 | Takahashi et al. | 341/120 |

FOREIGN PATENT DOCUMENTS

| | | |
|---|---|---|
| JP | 6-54873 | 9/1989 |
| JP | 9-74351 | 9/1995 |
| JP | 9-83348 | 9/1995 |

* cited by examiner

*Primary Examiner*—Richard Elms
*Assistant Examiner*—Pho M. Luu
(74) *Attorney, Agent, or Firm*—Reed Smith LLP; Stanley P. Fisher, Esq.; Juan Carlos A. Marquez, Esq.

(57) ABSTRACT

A semiconductor integrated circuit (FPLA) having a desired logical function achieved by arranging on a semiconductor chip variable logical circuits each having n×n (e.g., four) memory cells alternatively selected according to a combination of n (e.g., two) pairs of positive and negative phase signals and provided to output the positive and negative phase signals according to the data stored in the selected memory cell, variable wiring unit provided with signal lines for inter-connecting the variable logical circuits and switching elements for connecting/disconnecting signal lines intersecting to each other, a wiring connection state storage memory circuit where the states of the switching elements are stored.

27 Claims, 16 Drawing Sheets

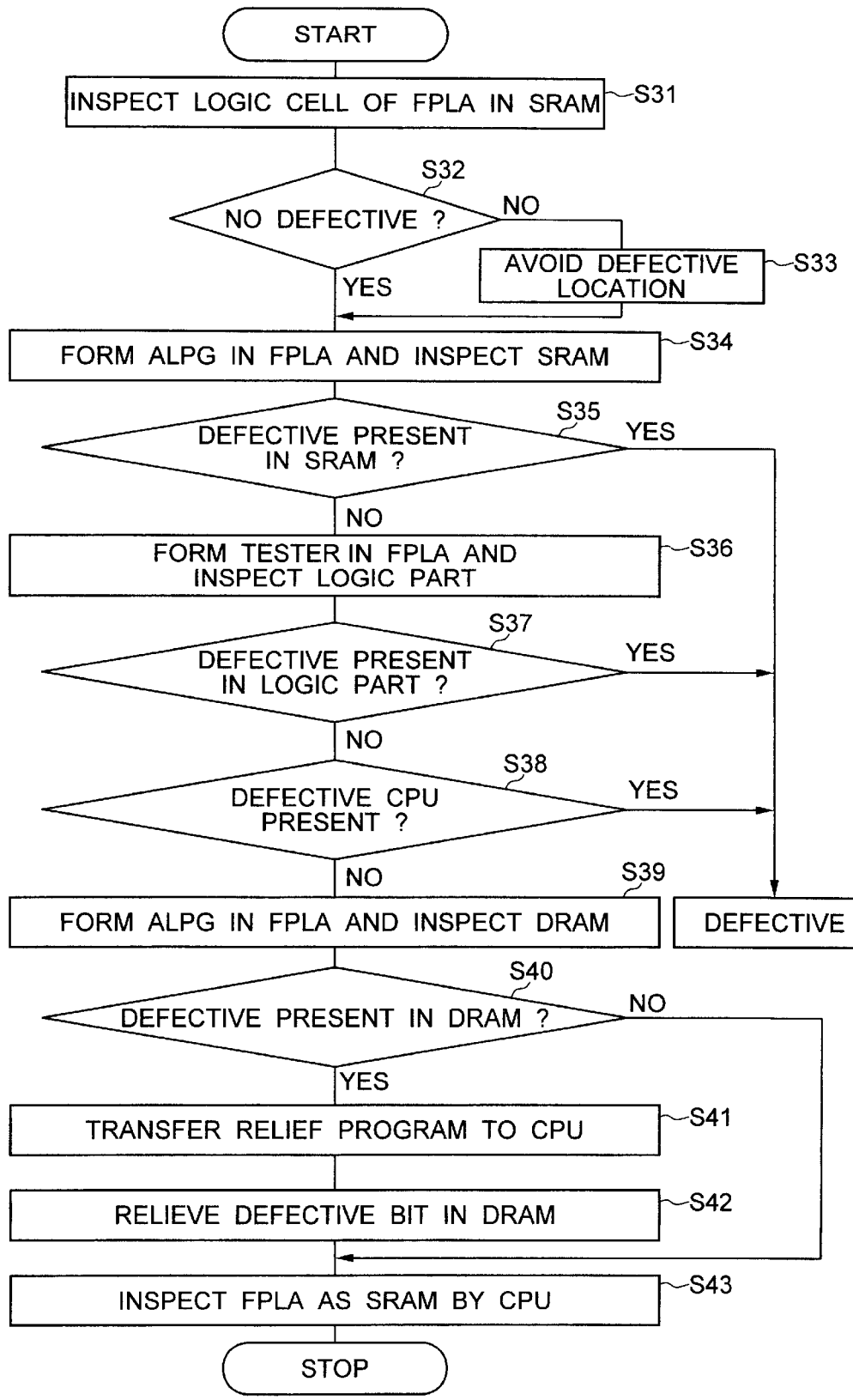

VARIABLE LOGICAL CIRCUIT, SEMICONDUCTOR INTEGRATED CIRCUIT, AND METHOD FOR MANUFACTURING SEMICONDUCTOR INTEGRATED CIRCUIT

TECHNICAL FIELD

The present invention relates to techniques which can be effectively applied to design and manufacturing of a semiconductor integrated circuit or a logic integrated circuit, and more particularly, to a technique which can be effectively applied to a programmable logical LSI (large scaled integrated circuit) enabling configuration of any logic and a variable logical circuit suitable for formation of the LSI.

BACKGROUND ART

In design of a semiconductor integrated circuit such as design of a logic integrated circuit, in these years, its functional design is expressed in the form of hard description language (HDL) description at the initial stage of the product design. In accordance with such a design technique, simulation logic verification can be established in a short time, and a semiconductor integrated circuit (which will be referred to also as the logical LSI, hereinafter) can be developed to a gate level with use of a design support program called a logic synthesis tool provided from an engineering design automation (EDA) vendor. Further, since an automatic layout tool can convert data at the gate level to such layout data as to be able to form a circuit on a semiconductor chip, a developing period of time can be shortened to a large extent.

FIG. 14 shows a procedure of development of a logic integrated circuit utilizing the afore-mentioned HDL description, i.e., from its design to its trial manufacture. That is, in the development of the logic integrated circuit, the function design of the logic integrated circuit to be implemented is first conducted. Then designed functions are described in a language such as HDL. And design data (HDL-described statement) is previously stored in a storage device such as a hard disk as a data file. With respect to the HDL description, a support tool for automatically preparing an HDL-described statement based on a state transition diagram or a flowchart.

Next, a verifying program for generating a test pattern called a test vector from the design data described in HDL is used to verify whether or not its operation is proper. When a defect is found through the verification, the HDL-described statement is modified.

Thereafter, the HDL described design data is converted by a program called a logic synthesis tool to design data at logic gate level. Such a logic synthesis tool is also supplied from a plurality of EDA vendors. The generated design data at logic gate level is again verified based on the test vector. When a defect is found through the verification, the design data of logic gate level is modified.

On the basis of the design data of logic gate level, layout data at element level is generated by a program called an automatic layout tool. Such an automatic layout tool is also supplied from a plurality of EDA vendors. The generated layout data is simulated by the test vector in the form of actual load including wiring delay, improper portions are modified and optimized. Thereafter, on the basis of the generated layout data, mask pattern data is generated by an artwork, and on the basis of the generated data, a mask is prepared.

After that, a logic integrated circuit is formed on a semiconductor wafer in a previous step, and the wafer is cut into chips, each of which is sealed with sealing material such as resin and assembled into a package.

In such a design/manufacturing system as mentioned above, however, many design steps and many stages of design data generation are required until it is completed as a final logic integrated circuit device, thus involving increase in the amount of data. Further, in a system-on-chip wherein an entire system is configured on a single semiconductor chip, since many various functional circuit blocks are used and arranged, the number of steps of verifying and modifying the design data is increased, which becomes a big design problem.

In addition, in the prior art design technique, as an element is finer, the number of masks used to manufacture a single semiconductor integrated circuit is increased and more expensive manufacturing device is required for finer processing, thus resulting in increase of design and manufacturing costs and reduction of a yield.

In the prior art design technique, further, a mask is required to be manufactured separately for each product, with the result that a developing period of time for a new product is prolonged. Furthermore, products required by users in these years tend to be small in the quantity of product and many in the number of product types, thus imposing an increased design burden and therefore with an increased cost. In addition, in a fine processing of deep submicron (0.1 $\mu$m or less) which is expected to be realized in future, a synchrotron orbit radiation (SOR) device is indispensable. Thus, investment of semiconductor device manufacturers in miniaturization becomes difficult and the amount of investment in the miniaturization is approaching to its limit.

As a technique for coping with the limit of such a prior art LSI design technique as mentioned above, there is a logical LSI (U.S. Pat. No. 4,870,302) which is called a field programmable gate array (FPGA) or field programmable logic array (FPLA) and can be configured to an arbitrary logic by a user. Due to such a technique, since manufacturers can focus on development of base chips and take a mass production system, this technique is a promising technique in future.

However, in the case of a general FPGA, variable logical circuits and variable switch circuits are formed into separated cells respectively, and these cells are arranged on a semiconductor chip as filled with tiles all thereover, which results in a redundant circuit arrangement. In addition, the prior art FPGA has been arranged as a relatively large scale circuit such as, for example, a variable logical circuit made up of a plurality of memory cells and transmission gates. For this reason, the conventional FPGA has had a defect that a user logic mount efficiency is very low, that is, the scale of mountable user logic is smaller (about 30 –40%) than the percentage of the logic scale of the entire FPGA. Therefore, since the FPGA is larger in chip size than and smaller in yield than an application specific integrated circuit (ASIC) having the same logic scale, a device price becomes high and thus the application of the FPGA is limited.

It is an object of the present invention to provide a variable logical circuit which can be suitably used to configure a programmable semiconductor integrated circuit (FPLA) having a high user logic mount efficiency.

Another object of the present invention is to provide a variable logical circuit which can be suitably used to configure a semiconductor integrated circuit capable of being operated on a low voltage and of configuring an arbitrary logic.

Another object of the present invention is to provide a technique for designing a semiconductor integrated circuit or a method for manufacturing the circuit, which can remarkably reduce the number of design steps and a developing period of time.

A further object of the present invention is to provide a semiconductor integrated circuit, even when an element as a part of a manufactured product is defective, which can easily substitute the defect element by a normal one for its normal function with a high yield.

The above and other objects as well as novel features of the present invention will be apparent from the description of this specification and attached drawings.

DISCLOSURE OF INVENTION

In the present application, a summary of typical features of the present invention will be explained as follows.

A variable logical circuit in accordance with the present invention includes $2^n$ (e.g., 4) memory cells which are alternatively selected according to a combination of 'n' pairs (e.g., two pairs) of positive and negative phase signals, and is arranged so as to output the positive and negative phase signals according to storage data in the selected memory cells.

Thus, a given number 'n' of input logic gates can be realized with the variable logical circuit by changing setting of data to memory cells, and a logic gate circuit can be configured with 2n memory cells. As result, even when a plurality of variable logical circuits can be combined into a sequential circuit, a less number of elements provided in a feedback path can be required and high speed operation can be realized.

Further, a variable logical circuit is arranged so as to output signals of positive and negative phases. For this reason, when a plurality of variable logical circuits are combined to realize a desired logic, the output of one variable logical circuit can be transmitted to another variable logical circuit as its input. In addition, even when the amplitude of the signal is made small, the signal is immune to noise and less erroneous transmission of the signal takes place because it is a differential signal. Furthermore, even when the circuit is designed to operate on a low power voltage, the circuit can cope with it.

A semiconductor integrated circuit in accordance with the present invention includes a plurality of variable logical circuits having $2^n$ memory cells each to be alternatively selected according to a combination of 'n' pairs of signals of positive and negative phases for outputting the signals of positive and negative phases according to data stored in the selected memory cells, variable wiring means having a plurality of signal lines for inter-connection between the variable logical circuits and switch elements for providing inter-connection or non-inter-connection between the intersected signal lines, and a wiring connection state memory circuit for storing the states of the switch elements of the variable wiring means, which are all provided on a single semiconductor chip.

In accordance with the present invention, since a semiconductor integrated circuit is arranged to include variable logical circuits based on memory cells, the resources of general-purpose memories and process techniques used in the prior art can be utilized and therefore an FPLA having a high integration can be realized. As a result, an increase in chip size can be suppressed and a user logic mount efficiency can be increased.

In a method for manufacturing a semiconductor integrated circuit in accordance with the present invention, an external test signal is inputted to inspect the variable logical circuits and, on the basis of resultant obtained information indicative of a defective location, a desired logic is formed with use of normal ones of the variable logical circuits other than the defective variable logical circuit. As a result, a product yield can be improved.

Further, the inspection of the variable logical circuits with use of the external test signal is carried out over a predetermined range on the chip, ones of the variable logical circuits determined as normal are used as a test circuit and used to inspect another internal circuit, and ones of the variable logical circuits are determined as normal after the test is used to form a desired logic. As a result, the burden of an external test device can be lightened and a test efficiency can be increased.

Furthermore, the variable logical circuits are inspected with use of the external test signal, ones of variable logical circuits determined as normal are used to form a test circuit, the test circuit is used to inspect another internal circuit, and the normal variable logical circuits after completion of the test are left as a memory circuit. As a result, not only a completed product can be used as a memory with a variable logic, and also it can be used also a usual memory.

BRIEF DESCRIPTION OF THE DRAWINGS

FIG. 18 is a flowchart showing a schematic test procedure when the system LSI of FIG. 17 is tested.

BEST MODE FOR CARRYING OUT THE INVENTION

Suitable embodiments of the present invention will be explained with reference to the attached drawings.

Figure 1:
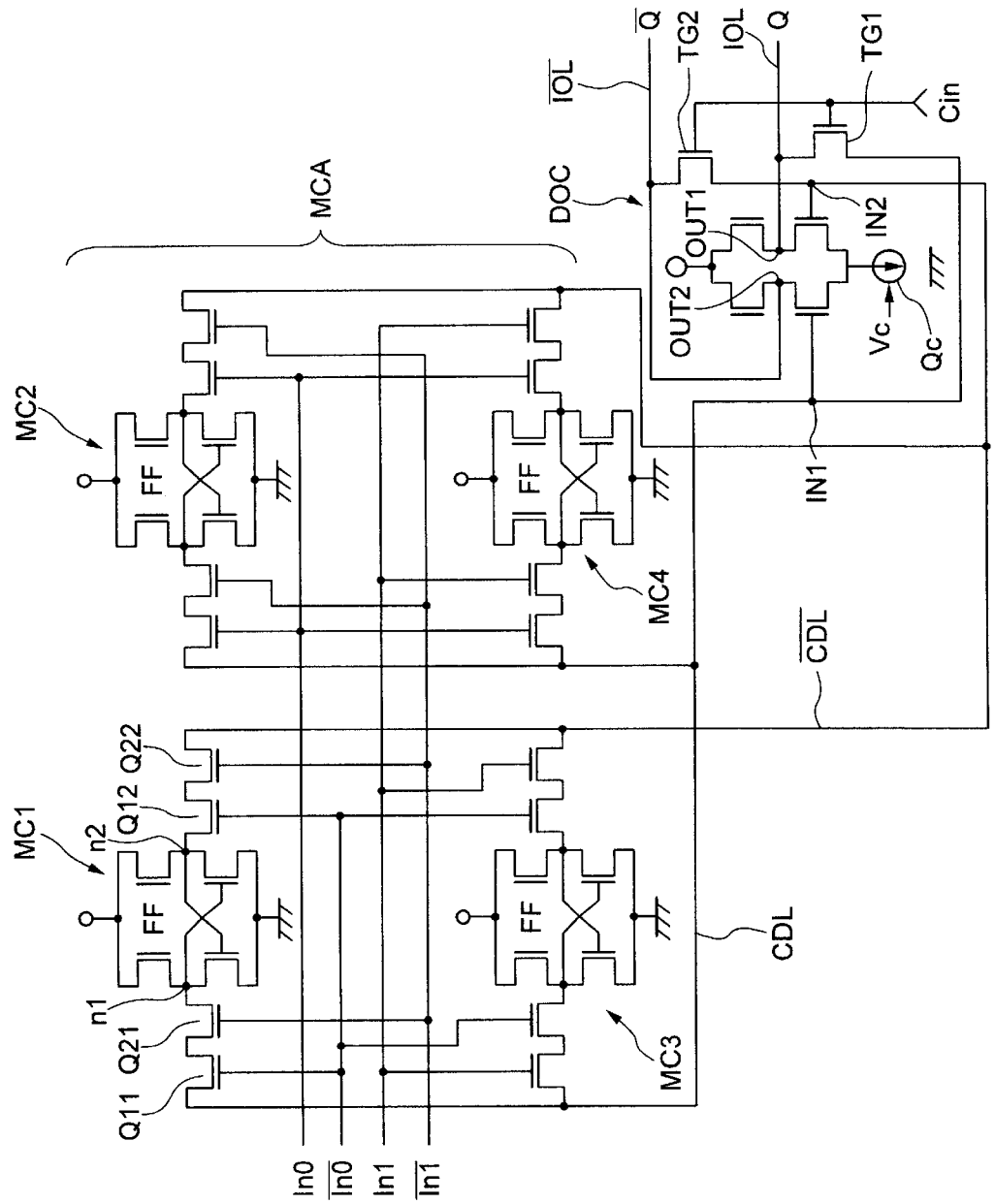
FIG. 1 is a circuit diagram showing an embodiment of a variable logical circuit in accordance with the present invention.
Figure 2:
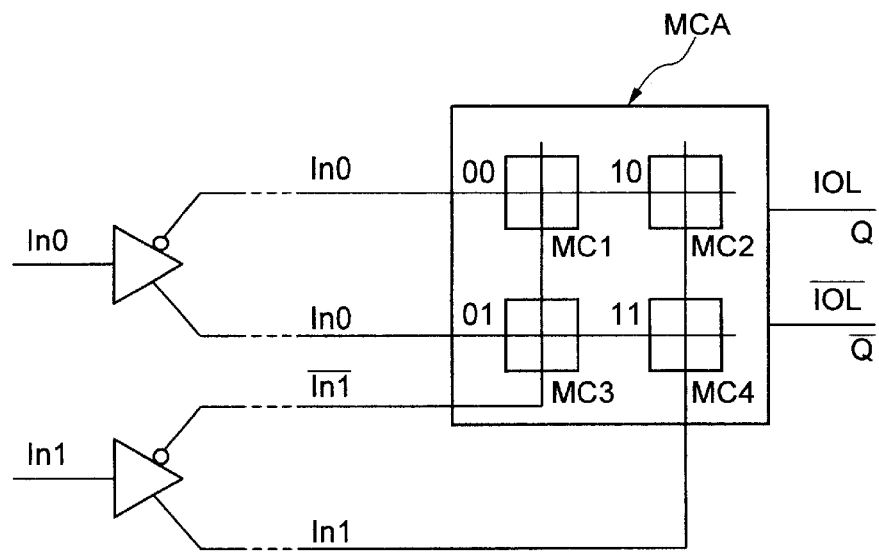
FIG. 2 is a conceptual view of the variable logical circuit of the embodiment of FIG. 1.

FIG. 1 is a circuit diagram of a variable logical circuit in accordance with a first embodiment of the present invention, and FIG. 2 is a conceptual view thereof. The variable logical circuit of FIG. 1 is an two-input logical circuit which includes four memory cells and a single complementary output circuit.

In FIG. 1, MC1, MC2, MC3 and MC4 denote memory cells each having a structure substantially similar to a memory cell forming a known static random access memory (SRAM), DOC denotes a data output circuit DOC composed of a differential amplification circuit, TG1 and TG2 denotes input transmission gates for supplying write data to the memory cells MC1 to MC4, which gates are arranged to supply signals corresponding to word select signals in a usual SRAM to a memory array MCA for logic setting including the four memory cells MC1 to MC4 as input signals In0, /In0, In1 and /In1.

The memory cells MC1 to MC4 of the variable logical circuit of the present embodiment are different from the memory cells forming a known SRAM in that each of the memory cells of the SRAM has a pair of selecting MOS FET's, while each of the memory cells of the present embodiment has two pairs of selecting MOS FET's. More specifically, the memory cells MC1 to MC4 forming the variable logical circuit of the present embodiment includes flip-flop circuits FF having two inverters input and output terminals of which are cross-coupled to each other, and selecting MOS FET's Qs11, Qs12; Qs21, Qs22 connected in series respectively with two input/output nodes n1 and n2 of the flip-flop circuits FF.

The flip-flop circuit FF may include two MOS inventors of P and N channel MOS FET's input and output terminals of which are cross-coupled to each other. Or the circuit FF may include two inverters provided as load elements such as depletion type MOS FET's or polysilicon resistors at a side of a power voltage Vcc of an N channel MOS FET, input and output terminals of which are cross-coupled to each other.

The variable logical circuit of the present embodiment is arranged so that any of signals In0, In1; In0, /In1; /In0, In1; /In0, /In1 of combinations of input signals In0 or /In0 and In1 or /In1 is applied to gate terminals of the selecting MOS FET's Qs11, Qs12 and Qs21, Qs22 of the above four memory cells MC1 to MC4. And the input/output nodes n1 and n2 of the flip-flop circuits FF of the memory cells MC1 to MC4 are arranged to be connected to common data signal lines CDL and /CDL coupled at their ends to a pair of input nodes IN1 and IN2 of the data output circuit DOC via the selecting MOS FET's Qs11, Qs12 and Qs21, Qs22, respectively.

Between the common data signal lines CDL and /CDL and input/output signal lines IOL and /IOL coupled to output nodes OUT1 and OUT2 of the output circuit DOC, input transmission gates TG1 and TG2 of MOS FET's are connected to gate terminals of which a common input control signal Cin is applied. The input transmission gates TG1 and TG2 are not limited to MOS FET's, but may each comprise, e.g., a logic gate circuit such as an AND gate. The data output circuit DOC is also not limited to such a differential amplification circuit as shown in FIG. 1. When the data output circuit DOC is formed as such a differential amplification circuit as shown in FIG. 1, it is desirable that the MOS FET Qc for constant current is to be arranged at the time of a data input when the common input control signal Cin causes the input transmission gates TG1 and TG2 to be put in its conduction state and to interrupt a current, e.g., by lowering a gate bias voltage Vc to 0V or the like.

Figure 3:
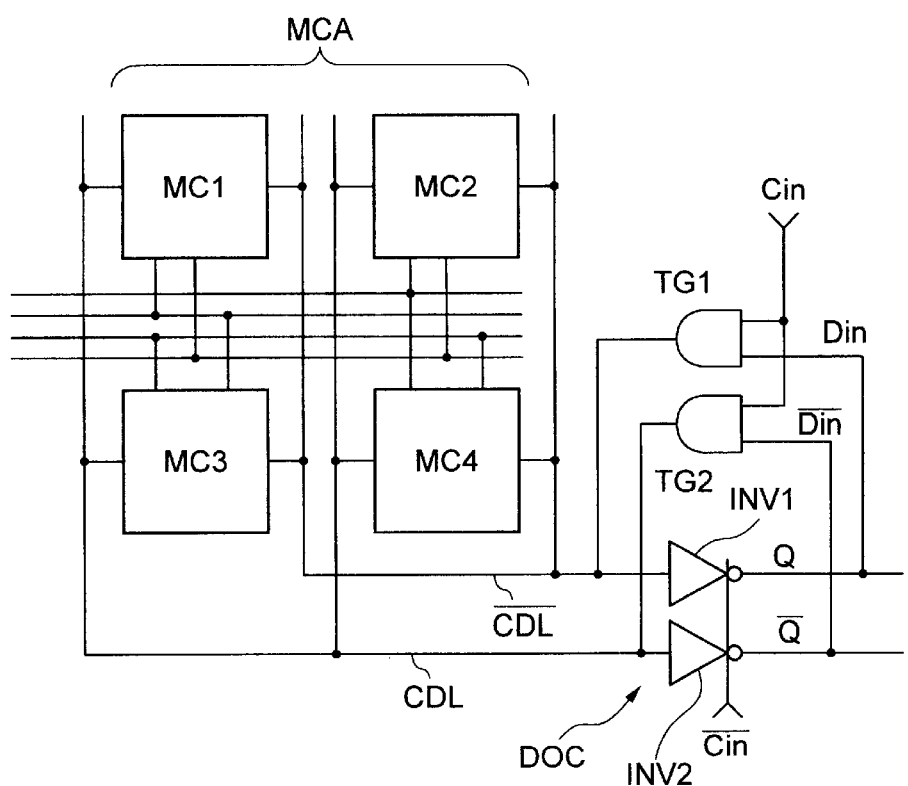
FIG. 3 is a logic configuration diagram of a variable logical circuit in accordance with another embodiment of the present invention.

FIG. 3 shows another embodiment of the variable logical circuit. The embodiment uses two inverters INV1 and INV2 in the data output circuit DOC. In this case, the inverters INV1 and INV2 are preferably so-called clocked inverters which are able to have output impedances according to an input control signal/Cin. Further, AND gates in place of the MOS FET's are used as the input transmission gates TG1 and TG2.

Explanation will then be made as to the operation of the variable logical circuit of the present embodiment and how to use the gate. As shown in FIG. 2 and in Table 1, the variable logical circuit of the present embodiment can be regarded as a memory array in which one of the four memory cells MC1 to MC4 having any of two pairs of differential signals In0, /In0; In1, /In1 as section signals and both having a high level are selected.

TABLE 1

| In0 | In1 | Selected memory cell |
|---|---|---|
| 0 | 0 | MC1 |
| 1 | 0 | MC2 |
| 0 | 1 | MC3 |
| 1 | 1 | MC4 |

Accordingly, such data as shown in the following Table 2 are previously written in the respective memory cells MC1 to MC4, signals outputted from the memory cells MC1 to MC4 according to the two input signals In0 and In1 correspond to a NAND logic (NAND), AND logic (AND), OR logic (OR), exclusive OR logic (EOR), NOR logic (NOR) or exclusive NOR logic (ENOR) of the input signals IN0 and In1, respectively.

In other words, the variable logical circuit of the present embodiment can realize the function of basic logic gate circuit necessary to form the logic of a logic LSI by suitably setting write data to the four memory cells MC1 to MC4. Accordingly when many of such variable logical circuits are disposed as dispersed on a semiconductor chip and when a variable wiring circuit including a group of wiring lines for inter-connection between any of the variable logical circuits and switch elements at crossings of signal lines is provided on the chip, there can be realized an LSI (which will be referred to as the FPLA, hereinafter) which can form any logic.

TABLE 2

| MC1 | MC2 | MC3 | MC4 | Logic output |
|---|---|---|---|---|
| 1 | 1 | 1 | 0 | NAND |
| 0 | 0 | 0 | 1 | AND |
| 0 | 1 | 1 | 1 | OR |
| 0 | 1 | 1 | 0 | EOR |
| 1 | 0 | 0 | 0 | NOR |
| 1 | 0 | 0 | 1 | ENOR |

Figure 4:
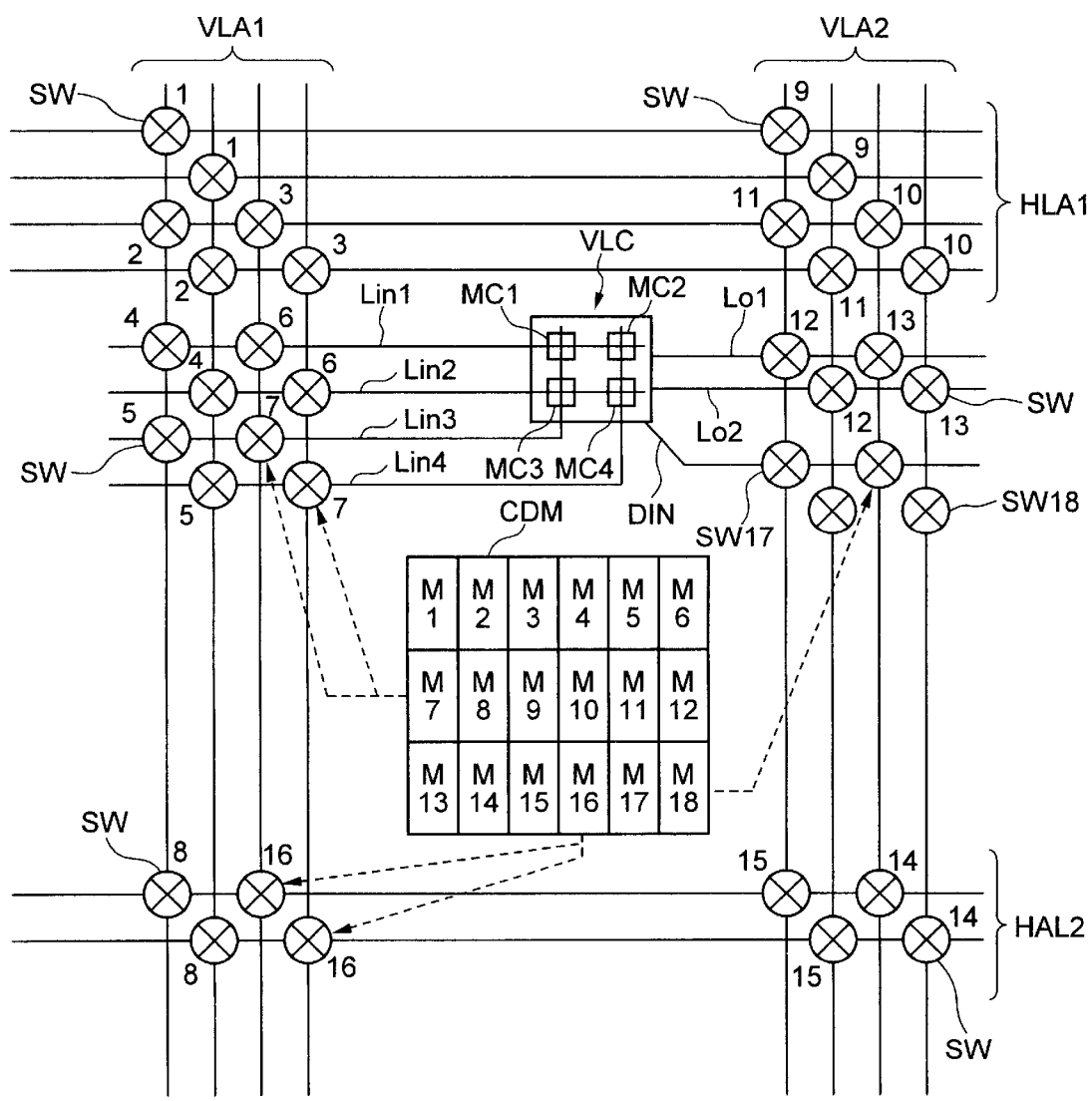
FIG. 4 is a schematic logic configuration diagram showing an example of arrangement of a variable wiring circuit which includes signal lines connected between variable logical circuits and switch elements provided therein.
Figure 5:
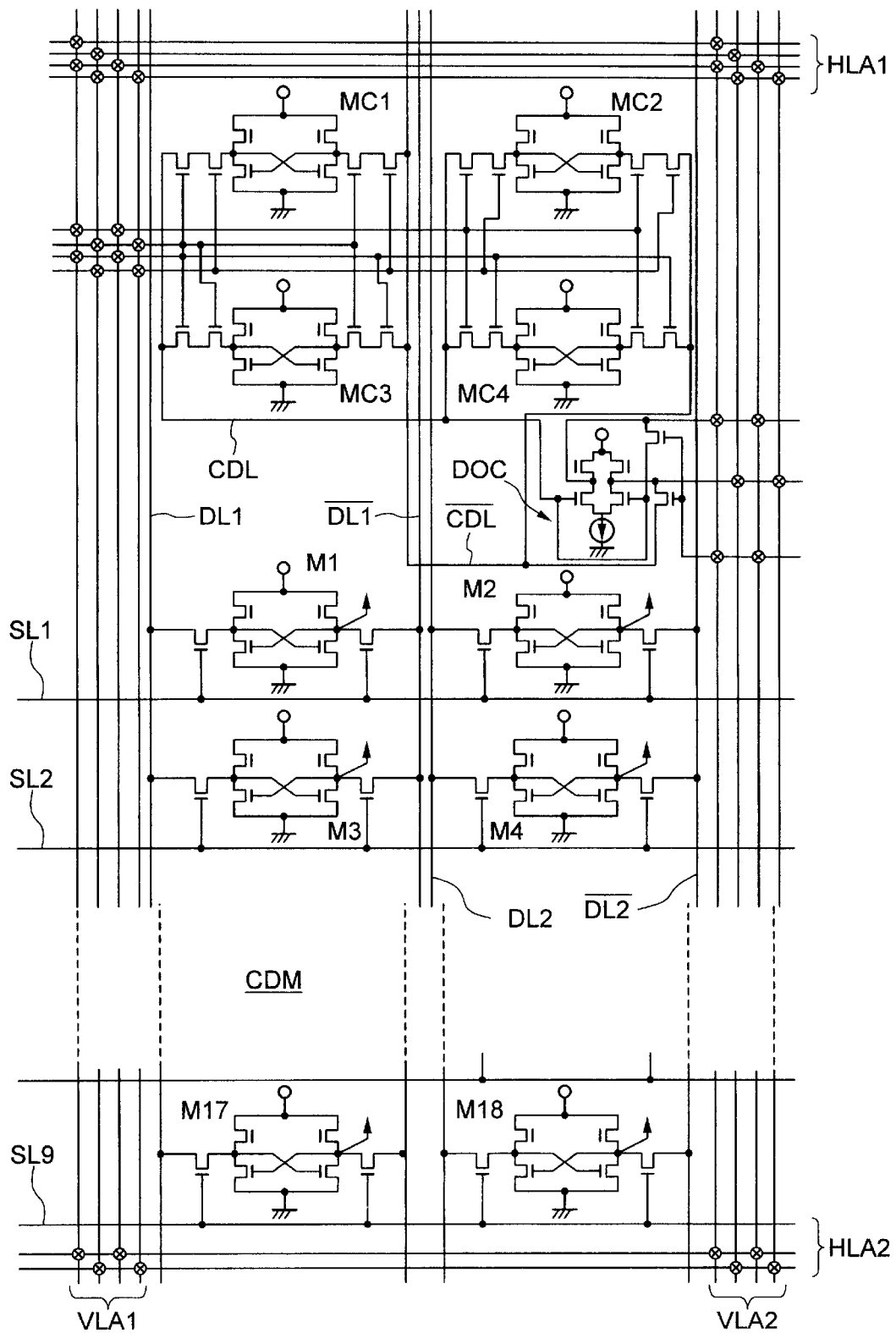
FIG. 5 is a circuit diagram showing a specific example of basic logic cells which can be configured into an FPLA.

Explanation next be made in connection with a specific example of a variable wiring circuit enabling inter-connection between any of the variable logical circuits when a plurality of such variable logical circuits of the above embodiment are provided on a semiconductor chip to form an FPLA, by referring to FIGS. 4 and 5.

As shown in FIG. 4, lattice-like wiring zones VLA and HLA are provided on a chip, the variable logical circuit VLC (memory cells MC1 to MC4 and data output circuit DOC) of the above embodiment and a wiring connection information memory circuit CDM are positioned in rectangular zones surrounded by the wiring zones VLA and HLA. Though not especially restricted, four signal lines are provided in each of vertical wiring zones VLA1 and VLA2; four and two signal lines are provided in horizontal wiring zones HLA1 and HLA2 respectively; and switch elements SW are provided at points crossed between the vertical and horizontal wiring zones VLA and HLA to electrically connect their vertical and horizontal signal lines.

Further provided even at points crossed between input signal lines Lin1 to Lin4 of the variable logical circuit VLC and the vertical signal lines VLA1 and at points crossed between output signal lines Lo1 and Lo2 of the variable logical circuit VLC and the vertical signal lines VLA2 are switch elements SW for electrical inter-connection between these signal lines. The number of such switch elements SW provided in a single variable logical circuit is not limited to a specific number, but is 34 in the present embodiment.

The wiring connection information memory circuit CDM is arranged to include 18 memory cells having a structure similar to that of the memory cells of the SRAM, the switch elements SW are associated with the corresponding 18 memory cells in the wiring connection information memory circuit CDM, and are set to on or off state according to wiring connection information stored in the corresponding memory cells.

Since the present embodiment is arranged to output two signals of positive and negative phases when receiving the two input signals (differential signals) are received, most ones of the switch elements SW are set in their two states by information stored in a single memory cell in the wiring connection information memory circuit CDM. Only an exception is switch elements SW17 and SW18 which connect a data input signal line DIN for supplying data to be set in the memory cells of the variable logical circuit VLC and signal lines of the vertical wiring zone VLA. The switch elements SW17 and SW18 are associated with the memory cells in the wiring connection information memory circuit CDM in a 1:1 relationship. In FIG. 4, when a number given in the wiring connection information memory circuit CDM has the same number given to a switch element, they have a correspondence relation.

FIG. 5 shows a more detailed circuit arrangement of the embodiment of FIG. 4 expressed at element level. In the drawing, ones of intersection points between vertical and horizontal signal lines marked with 'x' indicate locations where switch elements are provided. Memory cells M1 to M18 in the wiring connection information memory circuit CDM and memory cells MC1 to MC4 in the logic setting memory array have the same structure except that the number of selecting MOS FET's is smaller by one pair than that of memory cells M1 to M18 in the wiring connection information memory circuit CDM. Selection signal lines SL1 to SL9 of the memory cells M1 to M18 in the wiring connection information memory circuit CDM are provided separately from the signal lines of the wiring zones VLA and HLA.

Further, the 18 memory cells M1 to M18 in the wiring connection information memory circuit CDM are arranged in two rows as associated with two rows of the memory cells MC1 to MC4 in the logic setting memory array, input and output terminals of the memory cells M1, M3, . . . in the left-side row are connected to common data lines DL1 and /DL1 respectively, and input and output terminals of memory cells M2, M4, . . . in the right-side row are connected to common data lines DL2 and /DL2 respectively.

In the embodiment of FIG. 5, the selection signal lines SL1 to SL9 of the memory cells M1 to M18 in the wiring connection information memory circuit CDM are provided separately.

In FIG. 5, since the FPLA using the variable logical circuit VLC of the embodiment includes memory cells most of which have a similar structure to known SRAM memory cells, miniaturization techniques and know-how of layout design already developed in SRAM can be employed. As a result, when compared with conventional FPGA, high integration can be easily realized, a chip size can be made small, and a device price can be made low.

Figure 6:
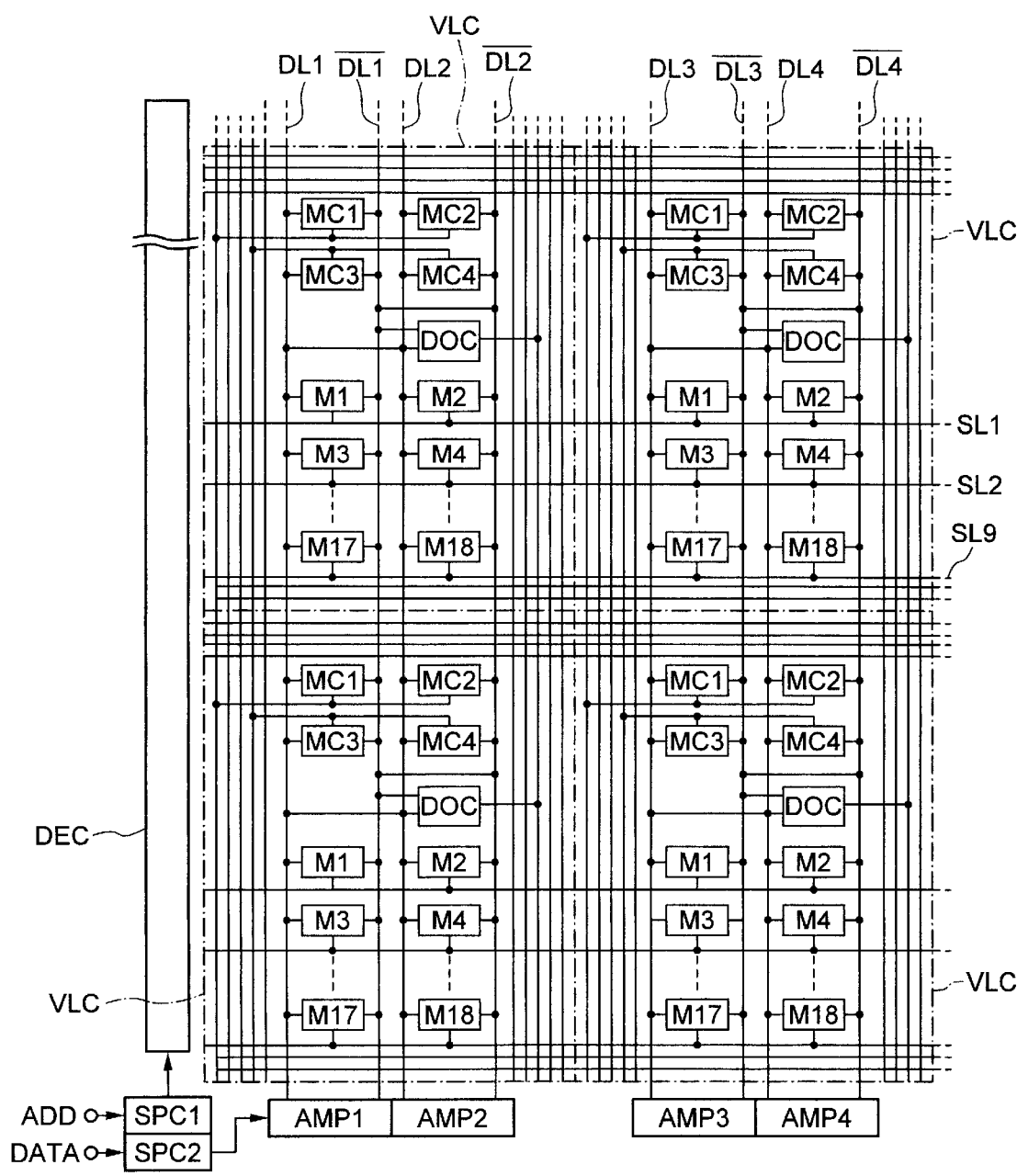
FIG. 6 is a block diagram of an exemplary arrangement of a write circuit to memory cells in a wiring connection information memory circuit forming logic setting memory cells and a variable wiring circuit in an FPLA having the basic logic cells of the embodiment arranged therein.

FIG. 6 shows an example of a system of writing wiring connection information in the memory cells M1 to M18 in the wiring connection information memory circuit CDM when the variable logical circuits VLC of the embodiment are provided on a semiconductor chip as arranged in a matrix form to form an FPLA. As shown in the same drawing, in the present embodiment, the selection signal lines SL1 to SL9 for supplying selection signals of the memory cells M1 to M18 in each circuit to a plurality of the variable logical circuits VLC are provided continually, and are also connected at their one ends to a decoder DEC. In FIG. 6, however, marks 'x' are omitted.

The decoder DEC is arranged to decode an address signal inputted from outside of the chip to put one of the selection signal lines SL1 to SL9 in its selection level. And input and output terminals of ones of the memory cells M1 to M18 in the plurality of variable logical circuits VLC connected to the signal line at the selection level are connected to data lines DL1, /DL1; DL2, /DL2 . . . . The data lines DL1, /DL1; DL2, /DL2; . . . are connected at their one ends with amplification circuits AMP1, AMP2, . . . having a structure similar to a sense amplifier used in an SRAM or the like, so that, when write data is externally inputted to the amplification circuits AMP1, AMP2, . . . , wiring connection information is written in the memory cell then selected.

Although not shown, the data lines DL1, /DL1; DL2, /DL2; . . . are extended to a side opposite to the amplification circuits AMP1, AMP2, . . . , and input and output terminals of the memory cells M1 to M18 in the plurality of variable logical circuits VLC arranged vertically side by side on the chip are commonly connected to the extended data lines DL1, /DL1; DL2, /DL2; . . . . And the decoder DEC is arranged to be associated even with the plurality of vertical variable logical circuits VLC, and functions to drive one of the selection signal lines SL1 to SL9 in any one of the plurality of vertical variable logical circuits VLC to the selection level.

In the present embodiment, further, in order to reduce the number of external terminals, an address signal ADD to be supplied to the decoder DEC is inputted serially from a single input terminal, is converted to a parallel signal by a serial/parallel conversion circuit SPC1 and then supplied to the decoder DEC. Similarly, wiring connection information DATA to be written in the memory cells M1 to M18 in the variable logical circuit VL is also inputted serially from a single input terminal, converted by a serial/parallel conversion circuit SPC2 to a parallel signal, and then supplied to the amplification circuits AMP1, AMP2, . . . .

Figure 7:
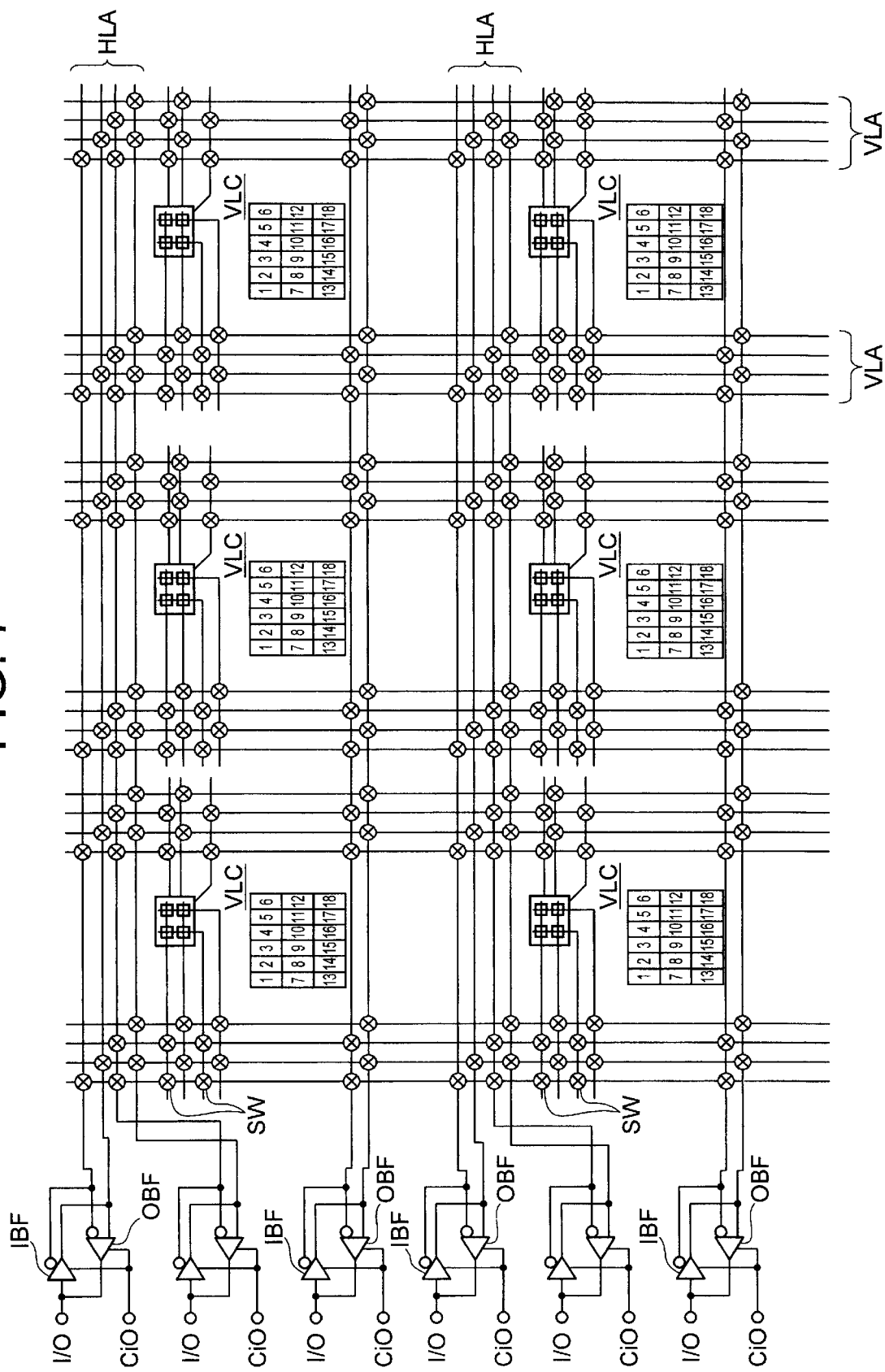
FIG. 7 is a logic configuration diagram showing an exemplary arrangement of input/output circuits of signals to logical circuits formed on the FPLA having the basic logic cells of the embodiment arranged therein.

Shown in FIG. 7 is an example of a system of writing logic setting information in the logic setting memory cells MC1 to MC4 when the variable logical circuits VLC of the embodiment are provided on a semiconductor chip as arranged in a matrix form to form an FPLA. As shown in the drawing, in the present embodiment, an input buffer IBF and an output buffer OBF are connected to each of terminals of signal lines on a chip peripheral edge side provided in the lattice-like horizontal wiring zone HLA.

Each input buffer IBF externally receives a single input signal, generates signals of positive and negative phases, supplies them to an internal circuit, whereas, the output buffer OBF receives the signals of positive and negative phases from the associated internal circuits and outputs any one of the signals of positive and negative phases as a single signal. Information is transmitted through the interior of the chip in the form of two signals of positive and negative phases. This is because the fact that the power voltage of an LSI is lowered in these years so that, even when the chip power voltage is lowered to such a low level as 3.0 V or 1.8 V, a proper signal can be transmitted while eliminating the need for changing the circuits and not affected by noise. In addition, signals to be supplied to the variable logical circuit VLC are of the positive and negative phases. Thus, in the variable logical circuit of the embodiment including the four logic setting memory cells, when an input signal is provided as it is as a selection signal of the logic setting memory cells MC1 to MC4, an output signal similar to that obtained when passed through usual two-input logic gate can be obtained.

In the present embodiment, although not limited thereto, the input buffer IBF and output buffer OBF connected to the same signal line are connected to a common external terminal I/O, so that only any one of the input buffer IBF and output buffer OBF is activated by a control signal Cio, whereby a common terminal is used for signal input and output, thus reducing the number of terminals. The control signal Cio can be externally provided to each of the common external terminals I/O, but the common external terminals I/O may be divided into several groups and the control signal Cio common to each group may be provided thereto. Further, it is desirable that the control signal Cio is to be supplied via the signal lines of the wiring zones VLA and HLA from the internal circuit of the chip. Though not shown in the drawing, the input and output buffers IBF and OBF may be similarly connected to each of terminals of the signal lines at a chip peripheral edge side provided in the vertical wiring zone VLA.

With such an FPLA arranged as mentioned above, predetermined data is written in the logic setting memory cells MC1 to MC4 in the variable logical circuit VLC provided on the chip, and predetermined wiring connection information is written in the memory cells M1 to M18 for storage of the wiring connection information, so that the states of the switch elements SW at the intersections between signal lines provided in the wiring zone VLA can be suitably set. As a result, a desired logic can be formed with use of any of the variable logical circuits VLC on the chip.

Figure 8:
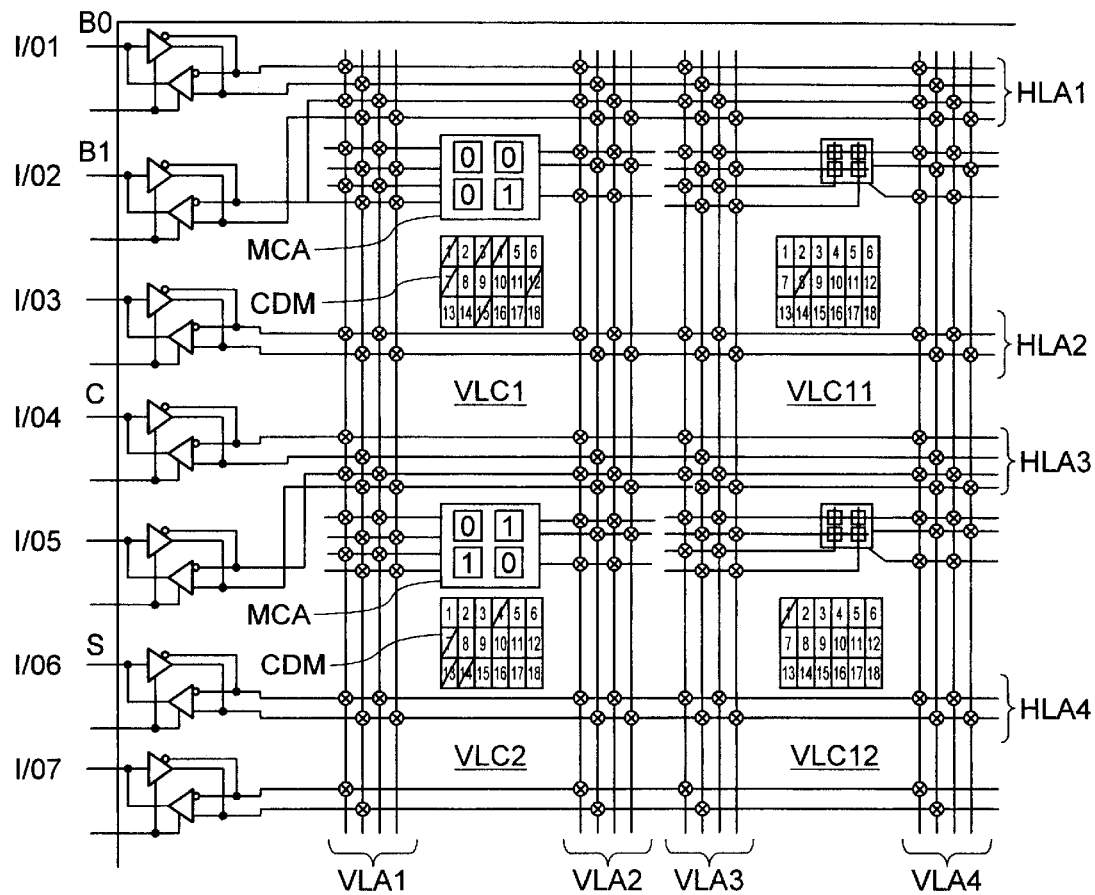
FIG. 8 is a diagram for explaining connection states of signal lines when half-adders are formed as an exemplary specific circuit in the FPLA to which the present invention is applied.
Figure 9:
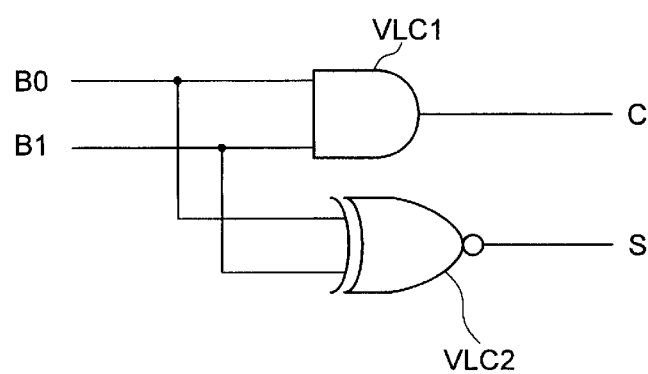
FIG. 9 is a logic configuration diagram of a half-adder expressed at gate circuit level as an exemplary circuit implemented with a connection state shown in FIG. 8.

FIG. 8 shows, as an example, a signal line connection system and a system of setting data to the logic setting memory array MCA when two variable logical circuits VLC are used to form a half-adder having such a logic function as shown in FIG. 9, input signals B0 and B1 are provided from external terminals I/O1 and I/O2 to output a carry signal C and a sum signal S from external terminals I/O4 and I/O6 in an FPLA having such an arrangement as shown in FIG. 7.

In FIG. 8, symbols "0" and "1" given in the logic setting memory array MCA denote data set in four memory cells (memory cells MC1 to MC4) respectively. It will be seen from Table 2 that an AND gate circuit comprises the variable logical circuit VLC1 and an EOR gate circuit comprises the variable logical circuit VLC2.

Meanwhile, some of the memory cells (memory cells M1 to M18) are hatched. For example, data written by "1" denotes that the corresponding switch elements SW is set at on state, and hatched ones of the memory cells M1 to M18 denote that data "0" is written so that the corresponding switch elements SW are set at on state. In FIG. 8, the input signals B0 and B1 inputted from the external terminals I/O1 and I/O2 are supplied from the signal line of the horizontal wiring zone HLA1 via the signal line of the vertical wiring zone VLA2 to the variable logical circuits VLC1 and VLC2, respectively. And an output signal of the variable logical circuit VLC1 is outputted from the signal line of the vertical signal lines VLA2 through the signal lines of the horizontal and vertical wiring zone VLA2 and VLA3 and through the signal line of the horizontal wiring zone HLA3 to an external terminal I/O4. Further, an output signal of the variable logical circuit VLC2 is outputted from the signal line of the vertical signal lines VLA2 (different from the output signal line of the variable logical circuit VLC1) through the signal line of a horizontal wiring zone HLA4 to an external terminal I/O6.

Figure 11:
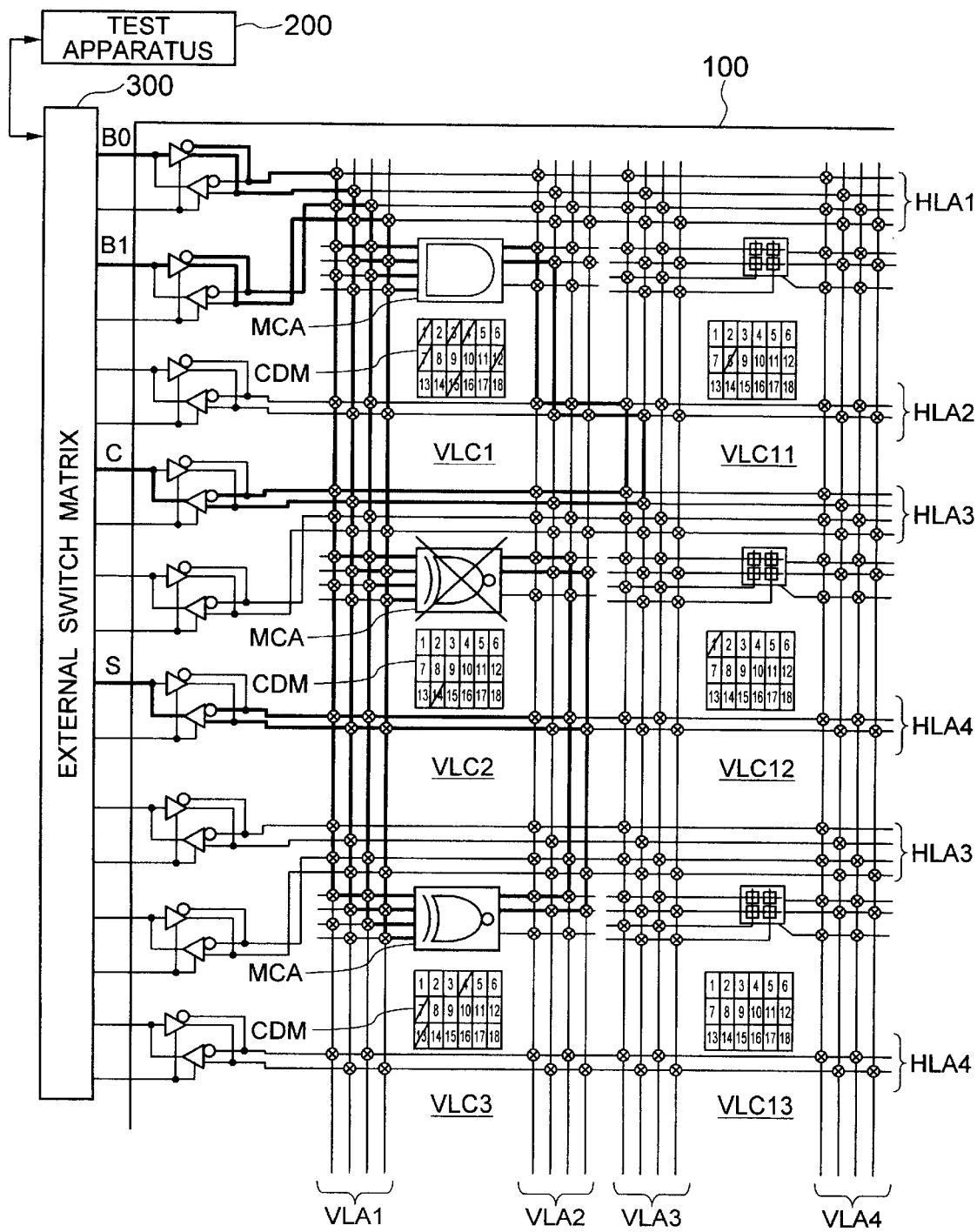
FIG. 11 is a diagram for explaining a method for re-forming a logical circuit corresponding to FIG. 8 when a defective logical circuit is found through a test of the FPLA arranged with the variable logical circuits of the present embodiment.
Figure 12:
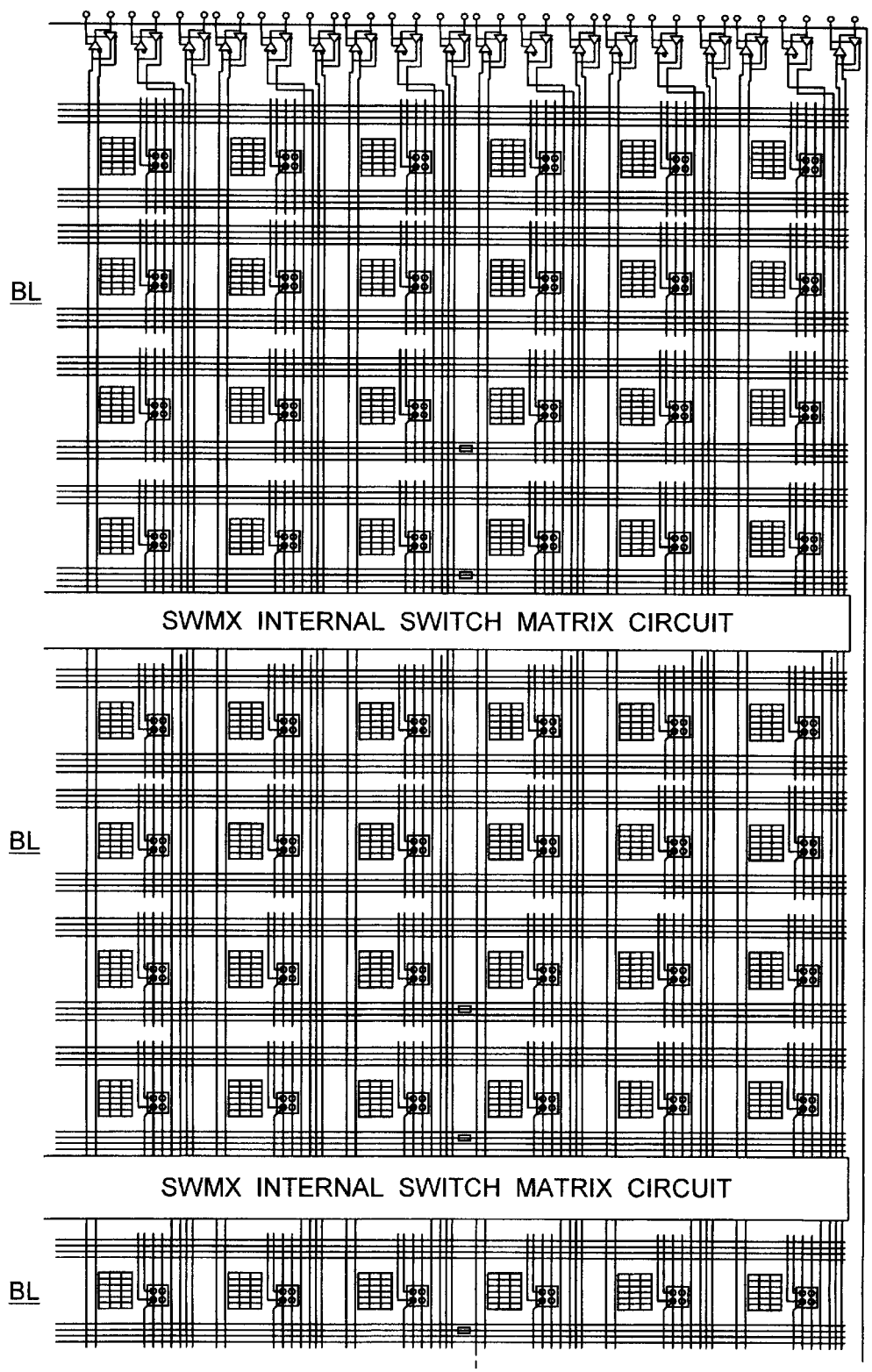
FIG. 12 is a plain diagram for explaining an exemplary layout on the FPLA to which a test method based on a procedure of FIG. 11 is suitably applied.

Explanation will be made as to a method for testing an PFLA and how to form a logic when the variable logical circuits VLC of the embodiment are provided on a semiconductor chip as arranged in a matrix form to form the FPLA, according to a flowchart of FIG. 10 and by referring to FIGS. 11 to 13. In this connection, the test is conducted desirably in a wafer form by probe inspection, but the wafer may be divided into chips for the test. In the case where the test is carried out in the wafer form, when pads to be used only in the test to externally provide the control signal Cio indicating the directions of signals of the input and output buffers IBF and OBF are previously provided, then the need for connecting the pads to external terminals can be eliminated and thus the number of external terminals (pins) can be reduced.

First of all, a test apparatus for testing the FPLA and a logic synthesis & write apparatus are previously prepared as external apparatuses. As an external apparatus forming the test apparatus or logic synthesis & write apparatus, a usual personal computer or the like can be used. And when a personal computer is employed as the test apparatus and logic synthesis & write apparatus, processings according to such a procedure as shown in FIG. 10 are prepared in the form of a program and the program is previously stored in a program storage area (such as a hard disk) of the personal computer. Further, as shown in FIG. 11, the test apparatus and the FPLA to be inspected are connected desirably by a switch matrix 300 which can connect any external terminal of the FPGA 100 to signal input/output terminals of the test apparatus 200.

Figure 10:
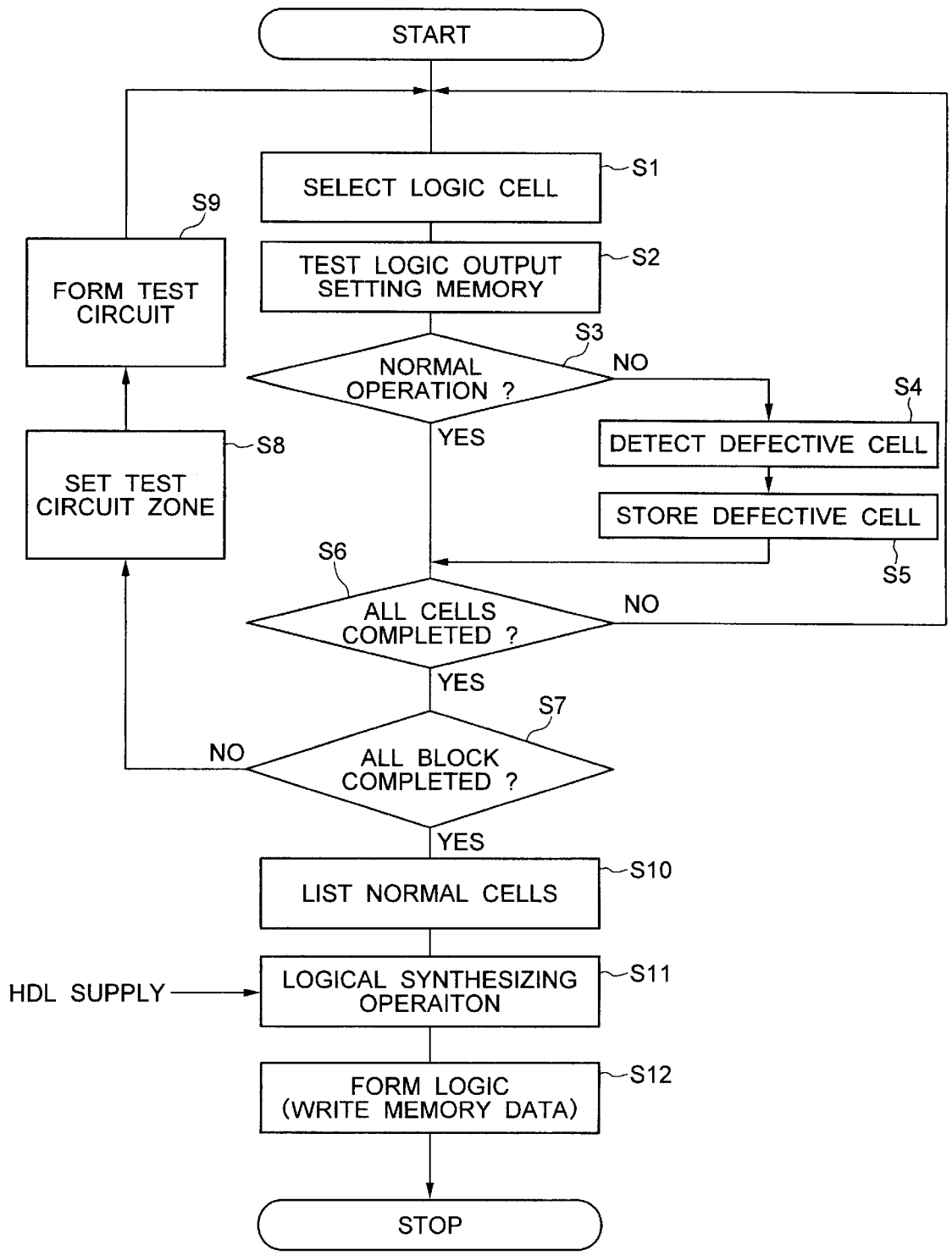
FIG. 10 is a flowchart showing a method for testing the FPLA arranged with use of the variable logical circuits of the embodiment and showing a method for forming a logic.

After such preparation as mentioned above is completed, the program is started to start the processings of FIG. 10. The test apparatus first generates a control signal to the switch matrix 300 so as to be able to input or output desired signals from desired terminals sets, and writes connection information in the memory cells in the wiring connection information memory circuit CDM to select one of the variable logical circuits (which will be referred to as the basic logic cell, hereinafter) in the FPGA (step S1).

Next the program sends and writes test data of 4 bits from the test apparatus to and in the logic setting memory cells MC1 to MC4 in the selected basic logic cell, reads it, repetitively compares it with an expected value by changing a pattern of the test data, and determines whether or not the memory cell is normal (steps S2 and S3). When the determination is abnormal, then the program identifies a defective logic cell based on the test result and stores the defective logic cell in the test apparatus (steps S4 and S5).

The defective logic cell then detected includes not only the logic setting memory cells MC1 to MC4 to which the test data is written and also the switch elements SW at intersections of the signal lines for transmission of the signal to the logic unit to be inspected and defective ones of the memory cells in the wiring connection information memory circuit CDM for storage of the ON/OFF state of the switch elements. Even in case the logic setting memory cells MC1 to MC4 are normal, when the switch element is broken or one of the memory cells in the wiring connection information memory circuit CDM is defective, then data written therein cannot be read out on the basis of which fact the program can grasp the presence of a defect. By devising the test pattern, the program may detect defective one of elements or a defective signal path in the defective logic cell and store the defective element or path therein.

When the absence of a defective logic cell is determined and after the defective logic cell is stored, the program proceeds to a step S6 to determine whether or not the above test was completed for all the basic logic cells in one block including a predetermined number of basic logic cells in the FPGA. And when it is determined that the test is not completed, the program returns to the step S1 to repeat the above operations. In this connection, the above block is regarded as a set of a sufficient number of basic logic cells to form a self test circuit to be explained later.

Such a block may be formed as visually distinguishable on the chip. But even when the block is formed as undistinguishable, it is suffice for the test apparatus to be able to recognize it as one block therein. As shown in FIG. 12, an internal switch matrix circuit (corresponding to the wiring zone and switch elements at the signal line intersections shown in FIG. 4 or so formed to a large scale) SWMX corresponding to the switch matrix 300 shown in FIG. 11 may be provided. In this case, each block can be visually distinguished on the chip.

In the step S6, when completion of the test of all the basic logic cells in one block is determined, the program proceeds to a step S7 to determine whether or not the test was completed for all the blocks on the chip. When it is determined that the test is not completed, the program sets a region (any of the blocks) forming the self test circuit and the basic logic cells to be used (step S8). The basic logic cell to be used is the cell which does not contain a defective element stored in the step S5. More specifically, in case, for example, such a half-adder as shown in FIG. 9 is formed, when a defect is detected in the variable logical circuit VLC2 as shown in FIG. 11, the defect is removed and instead the VLC3 is used to form an EOR gate circuit, thus realizing a half-adder with the variable logical circuits VLC1 and VLC3.

Next, a test circuit for testing a basic logic cell in another block is formed in the set zone (step S9). More concretely, the program writes predetermined data in the logic setting memory arrays in the basic logic cell of the above embodiment to form logic gates necessary to form the test circuit, generates inter-wiring connection information for connection between the logic gate circuits having the predetermined logic function thus formed, and writes it in the wiring connection information memory circuit CDM in the logic unit to thereby form the test circuit. The test circuit formed in the chip (FPLA) includes a micro-instruction controller, a data calculator and a data determination means for determining the read-out data and outputting its determination result. Applicable to the test circuit is a test technique called algorithmic memory pattern generator (ALPG) which generates a test pattern according to a predetermined algorithm and reads out written data.

After the test circuit is formed in the block already inspected in the FPLA in such a manner as mentioned above, the program, in the flowchart of FIG. 10, returns to the step S1 to sequentially select basic logic cells in another block with use of the test circuit and to write test data therein and to determine its normality or abnormality. And when the program determines in the step S6 that the inspection of all the basic logic cells in the objective block was completed, the program again forms a test circuit in the inspection-completed block to inspect another block not inspected yet. At this time, in place of again forming a test circuit, the test circuit already formed may be used to inspect a basic logic cell in another block.

When the inspection of all the blocks in the FPLA is finished in such a manner as mentioned above, the program lists normal ones of the basic logic cells on the basis of the storage information of the defective logic cells (step S10). Then, the program gives HDL-described design data to the personal computer or reads out HDL-described design data previously stored in the hard disk to perform logic synthesizing operation, and generates data necessary to form a desired logic on the FPLA (step S11). In more detail, the program generates data to be written in the logic setting memory array MCA in the basic logic cell necessary to form a desired logic as well as inter-wiring connection information to be written in the wiring connection information memory circuit CDM in the basic logic cell. Next, the program writes the data generated in the step S11 in the corresponding memory cell in the FPLA to realize a desired logic function on the FPLA (step S12).

In accordance with the afore-mentioned techniques, the test apparatus is only required to inspect only one block in the FPLA. And since the inspection of another block is automatically advanced by a self test circuit, during which the test apparatus can inspect another chip. In other words, a plurality of chips can be simultaneously inspected. In addition, the internal circuit is regularly arranged based on the basic logic cell, the test of the basic logic cell can be regarded as a very small memory array and can be carried out by a test technique similar to a memory. Thus the need for test based on complex test pattern so far conducted for a conventional logic LSI or general-purpose memory can be eliminated and therefore a time and cost taken for the test can be reduced.

Further, after a defective logic cell is detected, a logic can be formed with normal logic cells other than the defective one, which advantageously results in improvement in the product yield. At this time, furthermore, by devising the test pattern as mentioned above, it becomes unnecessary to remove the entire logic cell including a defective element. When the defective element is located in the logic setting memory array MCA, only the memory array including the defective element is removed from a normal memory array list; when the defective element is located in the wiring connection information memory circuit CDM, only the associated wiring connection information storage circuit is removed from a normal storage circuit list; and when the defective element is located in a switch element between the crossed signal lines, only the switch element is removed from a normal element list. And by avoiding such a defective element in this way, a logic can be formed.

Figure 13:
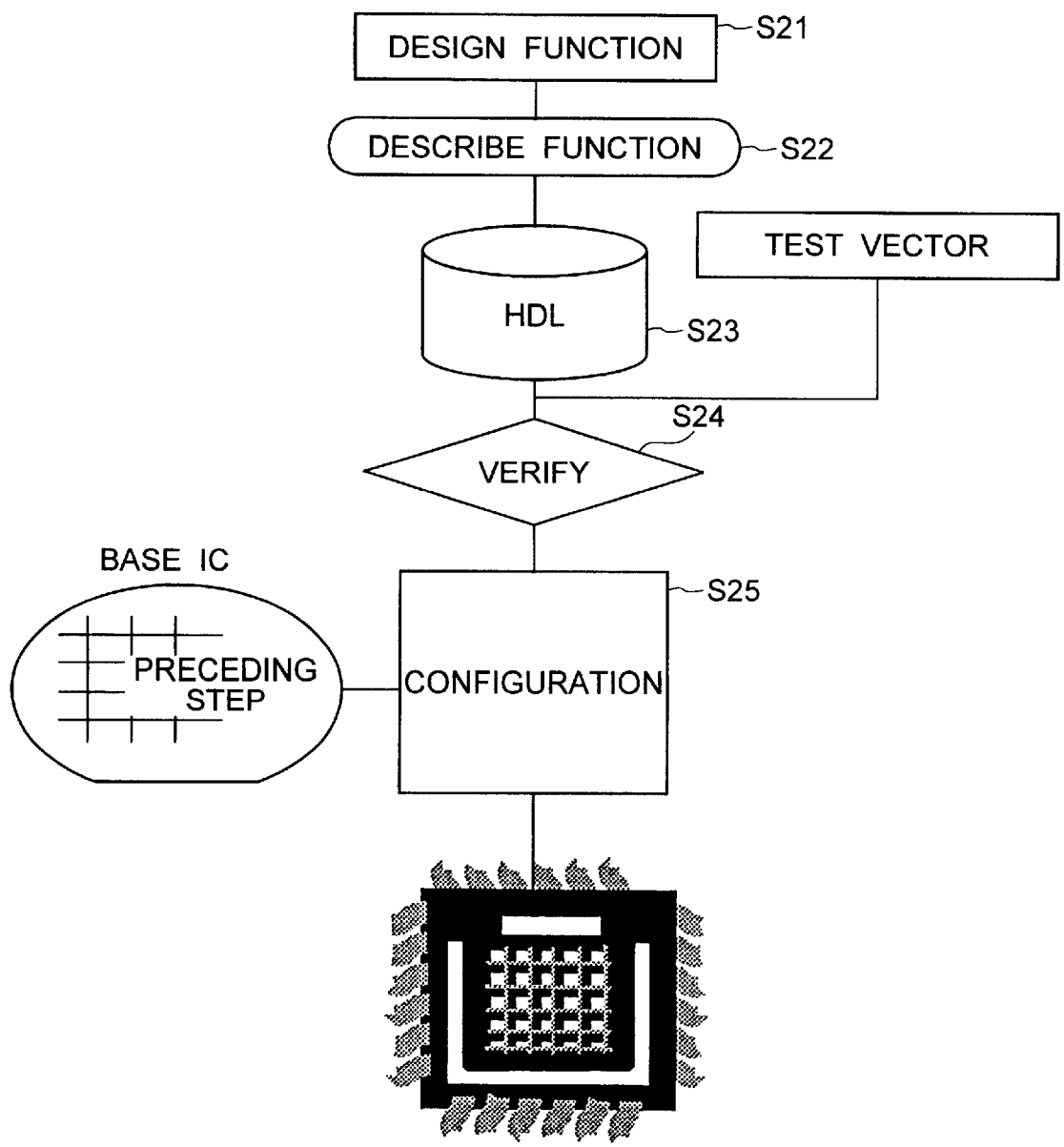
FIG. 13 is a flowchart showing a developing procedure of a logic integrated circuit using the PFLA in accordance with the present invention.

FIG. 13 shows a developing procedure of a logic integrated circuit when an FPLA to which the present invention is applied is used.

When a logic integrated circuit is developed with use of an FPLA to which the present invention is applied, the function design of a logic integrated circuit to be realized is first conducted (step S21). Next, the designed function is described in a language such as EDL (step S22) and stored as a data file in a storage such as a hard disk in a personal computer (step S23). With regard to the HDL description, as already mentioned above, a support tool for automatically creating an HDL-described statement from a state transition diagram or flowchart is already supplied from EDA vendors, it is convenient to use such a tools for that purpose.

Then with use of a verification program for generating a test pattern called a test vector, the HDL-described design data is verified concerning whether or not the operation is proper (step S24). When the program finds a defect through the verification, the user modifies the HDL-described design data. Thereafter the program forms the HDL-described logic function with use of the FPLA of the basic logic cell of the above embodiment (step S25).

Figure 14:
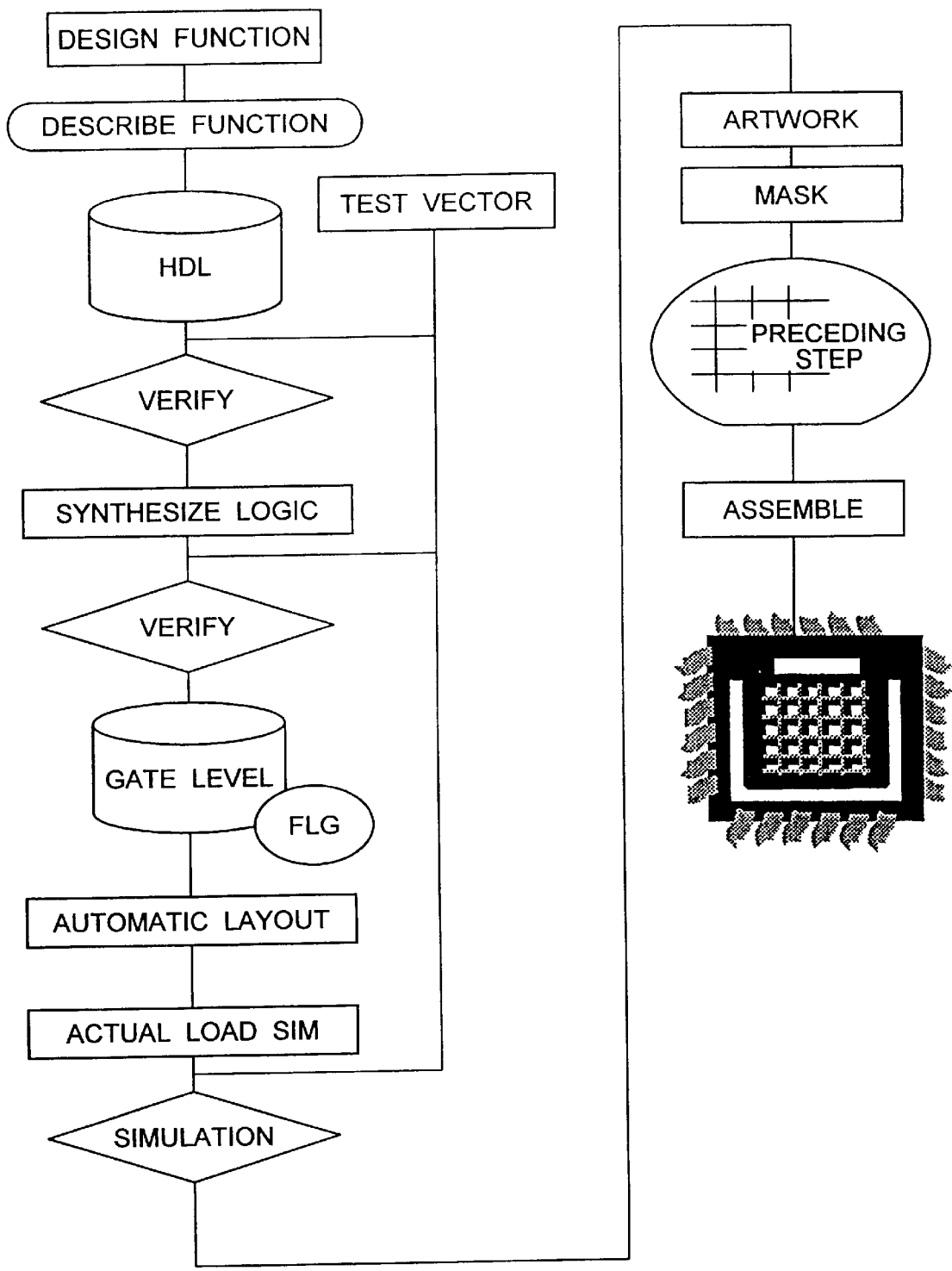
FIG. 14 is a flowchart showing a developing procedure of a prior art logic integrated circuit.

Since a logic integrated circuit having a desired function can be obtained through the aforementioned procedure, it will be obvious, when compared with FIG. 14 showing the conventional developing procedure, the application of the present invention enables remarkable shortening of the developing period of time.

Figure 15:
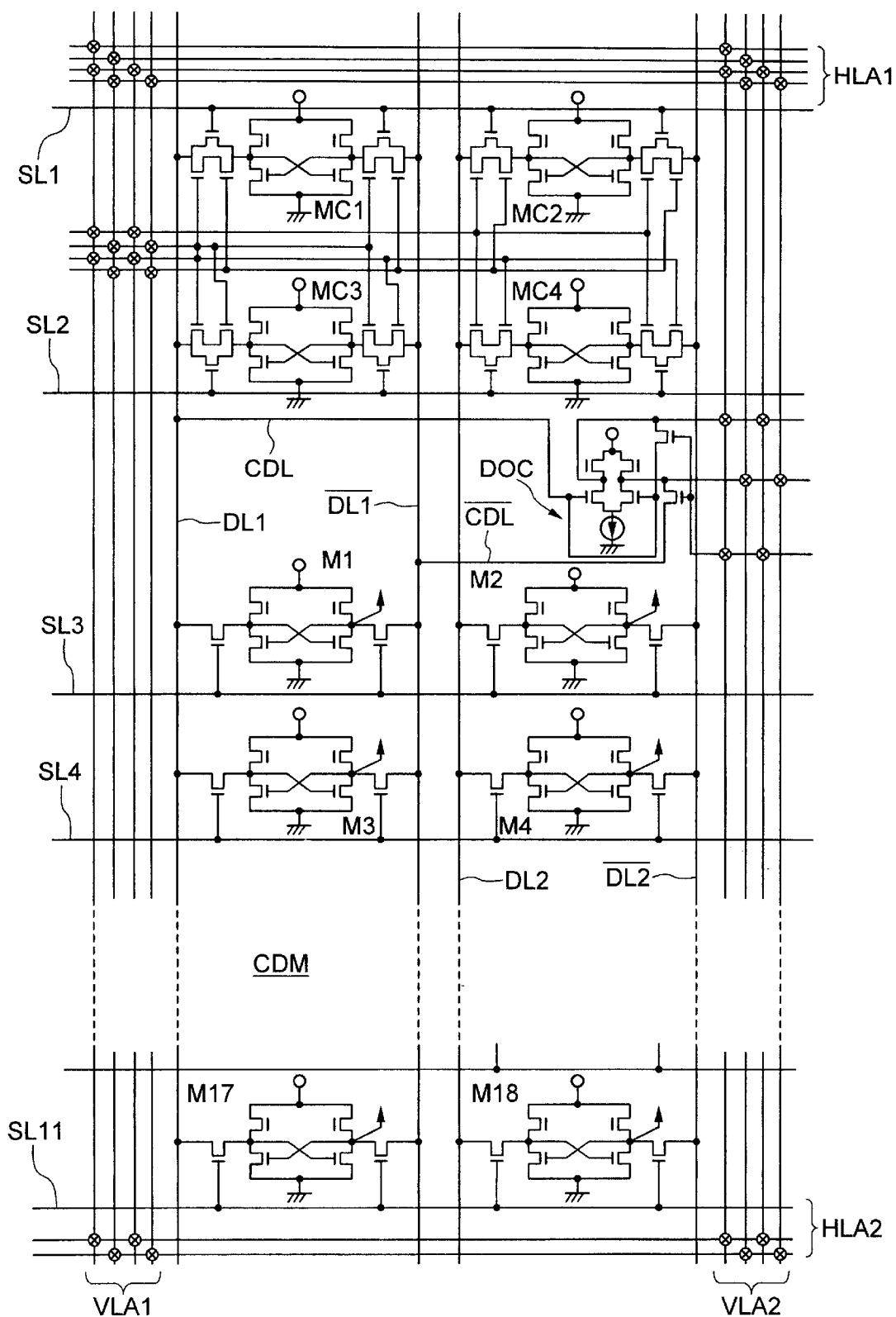
FIG. 15 is a circuit as a specific example of a circuit of basic logic cells in accordance with another embodiment of the present invention.
Figure 16:
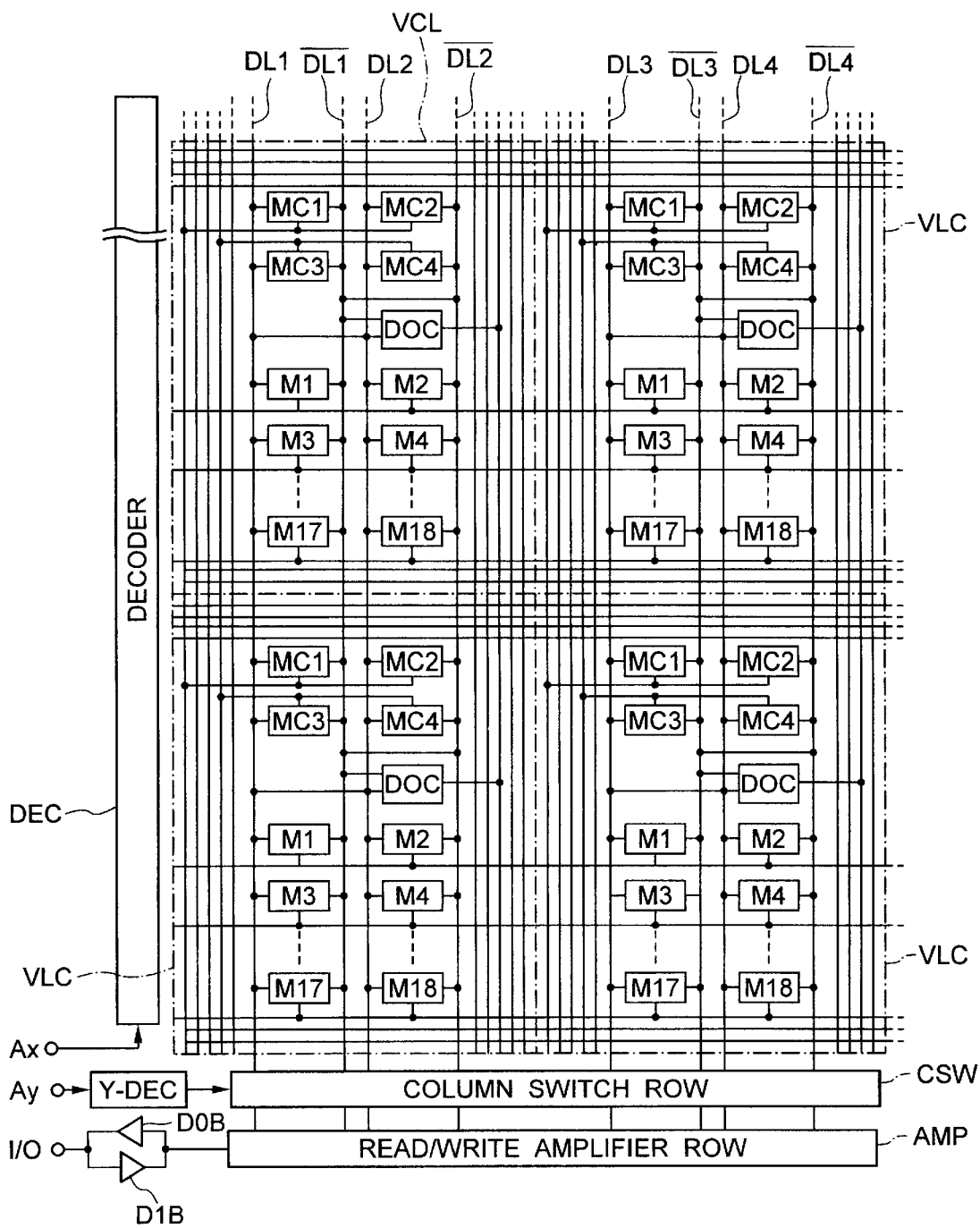
FIG. 16 shows another embodiment of the FPLA of arranged logic cells forming the variable logical circuits of the present invention of FIG. 15 and variable wiring circuits, in particular, arranged so that the memory cells of a wiring connection information memory circuit forming logic setting memory cells and a variable wiring circuit can be used as a RAM.

FIGS. 15 and 16 shows another embodiment of the present invention. The present embodiment is arranged so that the wiring connection information memory circuit CDM in a basic logic cell can be used as a RAM, i.e., a memory circuit enabling read and write operation thereof from time to time. The embodiment has a fundamental arrangement similar to the embodiment of FIG. 6. A difference from the embodiment of FIG. 6 is that an amplification circuit AMP for amplifying a potential difference between data lines DL and /DL connected to memory cells M1 to M18 of a wiring connection information storage circuit and for reading out data functions also as a write amplifier for increasing the potential difference between the data lines DL and /DL according to write data and for writing it in the associated memory cell, and that a column switch CSW is provided between the data lines DL and /DL and the amplification circuit AMP, and a Y decode circuit Y-DEC for receiving and decoding a Y address signal AY and for generating a signal to selectively turn on the column switch CSW is provided.

Also provided to the LSI of the present embodiment are a data input buffer DIB for providing externally-supplied write data to the amplification circuit AMP, a data output buffer DOB for externally outputting read data amplified by the amplification circuit AMP, an input/output terminal I/O common to the write and read data, and address input terminals for receiving an X address signal AX and a Y address signal AY both externally supplied respectively. The address input terminals for the X and Y address signals AX and AY may also comprise a single terminal to be shared by X and Y addresses and to be taken into the chip in an address multiplex scheme.

Figure 17:
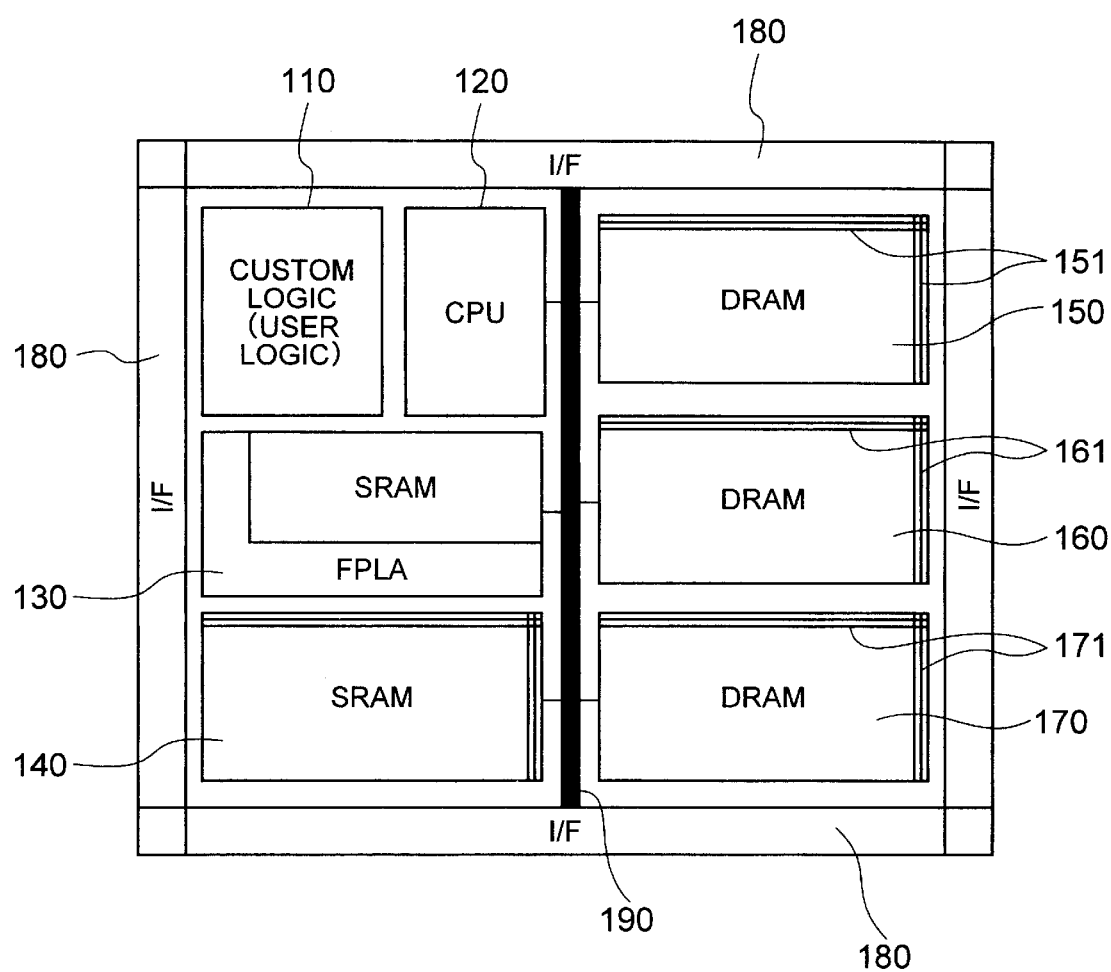
FIG. 17 is a block diagram of an embodiment of a system LSI as an example of LSI to which the present invention can be effectively applied.

FIG. 17 shows an application example of the present invention.

FIG. 17 shows a block diagram of an embodiment of a system LSI as an example of an LSI to which the present invention can be effectively applied, wherein the LSI is mounted on a single semiconductor chip of single crystal silicon or the like by a known semiconductor integrated circuit manufacturing technique.

In FIG. 17, reference numerals 110 to 170 denote internal circuits formed on the semiconductor chip, interface circuits 180 for signal input and output between the internal circuits 110–170 and an external apparatus. In the present embodiment, a 5 V interface circuit and a 3 V interface circuit are provided as the interface circuits 180, although the present invention is not limited thereto. Numeral 190 denotes an internal bus for inter-connection between the internal circuits 110–170 and between the internal circuits 110–170 and interface circuits 180.

Among the internal circuits 110–170, the internal circuit 110 is a custom logical circuit such as a user logical circuit which forms a logic function required by the users. The custom logical circuit 110 may comprise an FPLA whose logic can be formed arbitrarily by the user or may comprise an exclusive logical circuit separately designed. And when the custom logical circuit 110 is made in the form of an FPLA, the basic logic cell of the FPLA may use the variable logical circuit of the foregoing embodiment.

Further, reference numeral 120 denotes a central processing unit (CPU) for decoding an instruction from a program and performing the corresponding operation or calculation, numerals 130 and 140 denote static RAM (random access memory), 150–170 denote dynamic RAM's. The CPU 120 may comprise, in addition to a CPU in a narrow sense, a microprocessor which contains so-called microcomputer peripheral circuits such as a program ROM, working RAM, serial communication interface, timer circuit, and digital/analog conversion circuit.

The static RAM's 130 and 140 and dynamic RAM's 150 and 170 contain a memory peripheral circuit such as an address decoder which, when an address signal is applied through the internal bus 190, selects a corresponding memory cell. Further, the dynamic RAM's 150 and 170 contain a refresh control circuit which, even when a non-access time becomes long, cyclically performs pseudo-select operation to avoid loss of information charge of the memory cell.

In the present embodiment, each of the dynamic RAM's 150 to 170 is provided with preliminary memory rows and columns 151, 161 and 171 and with a so-called redundancy circuit which, when there is a defective bit in the memory array, replaces a memory row or column containing the defective bit by the preliminary memory row or column 151, 161 or 171 respectively, although not especially restricted thereto. And in the present embodiment, the FPLA of the second embodiment (FIG. 16) is provided as part of the static RAM 120.

In this way, the FPLA is provided as part of the static RAM 120. Therefore, when a test circuit is first formed according to a procedure which follows and is used as a usual SRAM after completion of the test, there is realized a system LSI which can be subjected to a self test prior to its shipping and can be shipped without overhead.

FIG. 18 schematically shows an entire test procedure of the system LSI of FIG. 17.

When the system LSI of FIG. 17 is tested, respective logic cells in the FPGA forming part of the SRAM 130 are first inspected. When the presence or absence of a defective logic cell is determined and a defective cell is found, the program performs such defective-cell avoiding operation (steps S31 to S33). Next, the program forms a test circuit (ALPG) in a zone of the inspection-completed FPGA other than the defective portion to test the remaining part of the SRAM 130 and the SRAM 140 (steps S34 and S35).

And when it is faild to find any defective portion in the SRAM's 130 and 140, the program forms a test circuit (logic tester) for testing the custom logical circuits 110 and CPU 120 in a zone of the PFLA other than the defective portion, and performs a test over the custom logical circuit 110 and CPU 120 (steps S36 to S38). At this time, the test pattern or test pattern generating program is stored in the SRAM 140 already inspected.

When it is faild to find a defect in the custom logical circuit 110 and CPU 120, the program forms a test circuit (ALPG) for testing the dynamic RAM's 150 and 170 in the zone of the FPLA other than the above defect portion and sequentially performs tests over the dynamic RAM's 150 and 170 (steps S39 and S40). And when a defect is found, the program stores it in the SRAM 140 or external storage device, and utilizes the redundancy circuit provided in the RAM's 150 and 170 to read a relief program for relieving the defective bit into the CPU 120, whereby the CPU 120 causes the program to be executed to relieve the bit (steps S41 and S42). Thereafter, the program reads a test program for causing the FPLA part of the SRAM 130 to operate as a memory into the CPU 120 in such a manner that the CPU causes the FPLA part of the SRAM 130 to be tested as an SRAM, and then finishes the test (step S43).

When the custom logical circuit 110 is formed as an FPLA, the program, after completing all the tests, forms a custom logic such as a user logic with use of normal ones of the logic cells of the custom logical circuit 110 other than the defective logic cell, and finishes it as a system LSI.

Although the invention made by the inventor of the present application has been explained in detail in connection with the embodiments, it goes without saying that the invention can be modified in various ways so long as it does not depart from the spirit and scope of the subject matter. For example, in the present embodiment, the memory cells having a structure similar to or identical to the memory cells of the SRAM have been used as the logic setting memory cells (memory cells MC1 to MC4) and the memory cells (M1 to M18) for wiring connection information storage. In place of such memory cells, however, memory cells having a structure identical to or similar to memory cells of a ferro-electric RAM (FRAM) for storing data by changing the electro-static capacity of the element or memory cells of another semiconductor memory may be used. However, the memory cells of a memory not requiring refresh operation rather than a dynamic RAM requiring refresh operation are preferable.

Further, the method of writing data into the memory cells is not limited to the electrical write method as in the embodiment but may be changed depending on such a method based on the property of the elements of the memory cells as an ion implanting method or a laser irradiating method.

Although the four logic setting memory cells MC1 to MC4 have been arranged in two rows and in two columns in the variable logical circuit in the foregoing embodiment, the memory cells may be arranged ,e.g. horizontally in a single row in FIG. 5. And in this case, it is desirable that the memory cells M1 to M18 in the wiring connection information memory circuit CDM is to be arranged correspondingly in four rows in correspondence to the above array.

Further, the four logic setting memory cells have been included in the basic logic cell as the variable logical circuit VLC to form any two-input logic gate circuit in the foregoing embodiment. However, nine logic setting memory cells may be provided in the basic logic cell to form a 3-input logic gate circuit. And at the time of forming an FPLA, the 2 and 3-input basic logic cells may be arranged on a chip as mixed at a suitable ratio therebetween.

Although explanation has been made in connection with the case where the FPLA of the variable logical circuit VLC of the invention as the basic logic cell is formed in part of the SRAM built in the system LSI in the application example, the idea of the invention is not restricted to such a system LSI but may be applied even to a usual SRAM. In this case, when the FPLA is left as a memory circuit, it can be used as a memory having a storage capacity, or can be used as a memory of any logic function such as an error coding code (ECC) circuit in the FPLA part on user's demand.

INDUSTRIAL APPLICABILITY

In the above explanation, the invention made by the inventor of this application has been made in connection with the FPLA as an example to form a user logic in application fields of its background. However, the present invention is not limited to the specific example. For example, the FPLA using the variable logical circuit VLC in accordance with the present invention can be used as a hardware simulator for verifying the logic design in an actual operating test by developing a logical circuit described in EDL on the FPLA.

What is claimed is:

1. A variable logical circuit comprising $2^n$ memory cells to be alternatively selected according to a combination of 'n' (n: positive integer) pairs of signals of positive and negative phases, wherein the signals of positive and negative phases are outputted according to storage data in selected memory cell.

2. A variable logical circuit as set forth in claim 1, wherein said memory cell comprises a flip-flop circuit and two pairs of selection switches connected respectively in series between a pair of I/O nodes of said flip-flop circuit and input and output terminals of said memory cell, and any of said signals of the positive and negative phases is applied to control terminal of the two pairs of selection switches.

3. A variable logical circuit as set forth in claim 1, wherein output circuits of differential amplification circuits having their input terminals commonly connected are provided to input and output terminals of said $2^n$ memory cells.

4. A variable logical circuit as set forth in claim 1, wherein output circuits of data input transmission gates having their input terminals commonly connected are provided to input and output terminals of said $2^n$ memory cells.

5. A semiconductor integrated circuit comprising:
- a plurality of variable logical circuits including $2^n$ memory cells to be alternatively selected according to a combination of signals of positive and negative phases for outputting signals of positive and negative phases according to storage data of the selected memory cells;
- variable wiring circuit including a plurality of signal lines for inter-connection between said variable logical circuits and switch elements for connection or disconnection between crossed signal lines; and
- a memory circuit for storage of wiring connection state for storing states of the switch elements of said variable wiring means,
- wherein said circuits and said variable wiring circuit are provided on a single semiconductor chip.

6. A semiconductor integrated circuit as set forth in claim 5, wherein said variable logical circuits and said memory circuit for storage of wiring connection state are combined into a single logic cell, and a plurality of said logic cells are arranged as aligned on a single semiconductor chip.

7. A semiconductor integrated circuit as set forth in claim 6, wherein memory cells of said memory circuit for wiring connection state storage are arranged as associated with an array state of the $2^n$ memory cells of said variable logical circuit.

8. A method for manufacturing the semiconductor integrated circuit as set forth in claim 6, comprising the steps of:
- externally inputting a test signal to inspect said variable logical circuit; and
- forming a desired logic with use of normal zone of said variable logical circuit other than said defective location on the basis of information indicative of a defective location obtained by said inspection step.

9. A method for manufacturing the semiconductor integrated circuit as set forth in claim 8, comprising the steps of:
- performing inspection of said variable logical circuit with use of an external test signal over a predetermined range on a chip;
- forming a test circuit with use of the variable logical circuit determined as normal and performing inspection of another internal circuit; and
- forming a desired logic with use of the normal variable logical circuit after completion of said inspection.

10. A semiconductor integrated circuit as set forth in claim 7, wherein input and output terminals of the memory cells of said variable logical circuit and input and output terminals of the memory cells of said memory circuit for wiring connection state storage associated therewith are connected to associated identical data lines.

11. A method for manufacturing the semiconductor integrated circuit as set forth in claim 7, comprising the steps of:
- externally inputting a test signal to inspect said variable logical circuit; and
- forming a desired logic with use of normal zone of said variable logical circuit other than said defective location on the basis of information indicative of a defective location obtained by said inspection step.

12. A method for manufacturing the semiconductor integrated circuit as set forth in claim 11, comprising the steps of:
- performing inspection of said variable logical circuit with use of an external test signal over a predetermined range on a chip;
- forming a test circuit with use of the variable logical circuit -determined as normal and performing inspection of another internal circuit; and
- forming a desired logic with use of the normal variable logical circuit after completion of said inspection.

13. A semiconductor integrated circuit as set forth in claim 10, wherein said data lines are connected to associated amplification circuits and storage information of the memory cells of said memory circuit for wiring connection state storage is read out by said associated amplification circuits.

14. A method for manufacturing the semiconductor integrated circuit as set forth in claim 10, comprising the steps of:
- externally inputting a test signal to inspect said variable logical circuit; and
- forming a desired logic with use of normal zone of said variable logical circuit other than said defective location on the basis of information indicative of a defective location obtained by said inspection step.

15. A method for manufacturing the semiconductor integrated circuit as set forth in claim 14, comprising the steps of:
- performing inspection of said variable logical circuit with use of an external test signal over a predetermined range on a chip;
- forming a test circuit with use of the variable logical circuit determined as normal and performing inspection of another internal circuit; and
- forming a desired logic with use of the normal variable logical circuit after completion of said inspection.

16. A method for manufacturing the semiconductor integrated circuit as set forth in claim 13, comprising the steps of:
- externally inputting a test signal to inspect said variable logical circuit; and
- forming a desired logic with use of normal zone of said variable logical circuit other than said defective location on the basis of information indicative of a defective location obtained by said inspection step.

17. A method for manufacturing the semiconductor integrated circuit set forth in claim 16, comprising the steps of:
- performing inspection of said variable logical circuit with use of an external test signal over a predetermined range on a chip;
- forming a test circuit with use of the variable logical circuit determined as normal and performing inspection of another internal circuit; and
- forming a desired logic with use of the normal variable logical circuit after completion of said inspection.

18. A semiconductor integrated circuit as set forth in claim 6, comprising a decode circuit for decoding an input address signal to select any of the memory cells of said memory circuit for wiring connection state storage.

19. A method for manufacturing the semiconductor integrated circuit as set forth in claim 18, comprising the steps of:
- externally inputting a test signal to inspect said variable logical circuit; and
- forming a desired logic with use of normal zone of said variable logical circuit other than said defective location on the basis of information indicative of a defective location obtained by said inspection step.

20. A method for manufacturing the semiconductor integrated circuit set forth in claim 17, comprising the steps of:

performing inspection of said variable logical circuit with use of an external test signal over a predetermined range on a chip;

forming a test circuit with use of the variable logical circuit determined as normal and performing inspection of another internal circuit; and forming a desired logic with use of the normal variable logical circuit after completion of said inspection.

21. A semiconductor integrated circuit as set forth in claim 6, comprising a serial/parallel conversion circuit for converting said address signal inputted as a serial signal to a parallel signal and supplying said parallel signal to said decode circuit.

22. A method for manufacturing the semiconductor integrated circuit as set forth in claim 21, comprising the steps of:

externally inputting a test signal to inspect said variable logical circuit; and forming a desired logic with use of normal zone of said variable logical circuit other than said defective location on the basis of information indicative of a defective location obtained by said inspection step.

23. A method for manufacturing the semiconductor integrated circuit set forth in claim 22, comprising the steps of:

performing inspection of said variable logical circuit with use of an external test signal over a predetermined range on a chip;

forming a test circuit with use of the variable logical circuit determined as normal and performing inspection of another internal circuit; and forming a desired logic with use of the normal variable logical circuit after completion of said inspection.

24. A method for manufacturing the semiconductor integrated circuit set forth in claim 5, comprising the steps of:

externally inputting a test signal to inspect said variable logical circuit; and forming a desired logic with use of normal zone of said variable logical circuit other than said defective location on the basis of information indicative of a defective location obtained by said inspection step.

25. A method for manufacturing the semiconductor integrated circuit as set forth in claim 24, comprising the steps of:

performing inspection of said variable logical circuit with use of an external test signal over a predetermined range on a chip;

forming a test circuit with use of the variable logical circuit determined as normal and performing inspection of another internal circuit; and forming a desired logic with use of the normal variable logical circuit after completion of said inspection.

26. A semiconductor integrated circuit comprising:

a logical circuit including a plurality of basic logic cells having a plurality of memory cells for setting of logic outputs thereof, switch elements for connection or disconnection between crossed signal lines, and a memory circuit for storing states of said switch elements, said logical circuit being able to form any logic;

a memory for reading or writing data therefrom or therein from time to time; and a custom logical circuit or a central processing unit, wherein said logical circuit is formed as part of said memory.

27. A method for manufacturing the semiconductor integrated circuit set forth in claim 26, comprising the steps of:

performing inspection of said logical circuit with use of an external test signal;

using the logical circuit determined as normal to form a test circuit;

performing inspection of another internal circuit with use of said test circuit; and leaving said logical circuit as a memory circuit after completion of said inspection.

* * * * *